(12) United States Patent
Liu et al.

(10) Patent No.: US 8,253,506 B2
(45) Date of Patent: Aug. 28, 2012

(54) WIDEBAND TEMPERATURE COMPENSATED RESONATOR AND WIDEBAND VCO

(75) Inventors: Li Liu, San Diego, CA (US); Chiewcharn Narathong, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 25 days.

(21) Appl. No.: 12/897,918

(22) Filed: Oct. 5, 2010

(65) Prior Publication Data
US 2012/0081188 A1  Apr. 5, 2012

(51) Int. Cl.
*H03C 3/22* (2006.01)
*H03L 1/02* (2006.01)

(52) U.S. Cl. .............. 331/177 V; 331/36 C; 331/117 R; 331/176

(58) Field of Classification Search .................... 331/16, 331/17, 36 C, 117 FE, 117 R, 167, 176, 177 V
See application file for complete search history.

(56) References Cited

U.S. PATENT DOCUMENTS

| | | | |
|---|---|---|---|
| 7,116,183 B2 | 10/2006 | Wu | |
| 7,129,801 B2 | 10/2006 | Wu | |
| 7,199,698 B1 * | 4/2007 | Goldfarb | 331/177 V |
| 7,230,504 B1 * | 6/2007 | Marques et al. | 331/117 FE |
| 7,295,077 B2 * | 11/2007 | Thomsen et al. | 331/10 |
| 7,358,823 B2 * | 4/2008 | Abadeer et al. | 331/177 V |
| 7,372,343 B2 * | 5/2008 | Pittorino | 331/117 FE |
| 7,463,097 B2 * | 12/2008 | Costa et al. | 331/14 |
| 7,612,626 B2 * | 11/2009 | Tang | 331/179 |
| 7,782,151 B2 * | 8/2010 | Buell | 331/177 V |
| 8,067,995 B2 * | 11/2011 | Tsukizawa | 331/177 V |
| 2003/0227341 A1 * | 12/2003 | Sawada | 331/177 V |
| 2005/0110589 A1 * | 5/2005 | Loke et al. | 331/177 V |
| 2005/0128017 A1 | 6/2005 | Meltzer | |
| 2006/0208806 A1 | 9/2006 | Chien | |
| 2007/0085620 A1 | 4/2007 | Ohkubo et al. | |
| 2007/0146082 A1 * | 6/2007 | Ohara et al. | 331/16 |

(Continued)

FOREIGN PATENT DOCUMENTS

JP       2007013898 A       1/2007

OTHER PUBLICATIONS

Oehm et al., "Linear Controlled Temperature Independent Varactor Circuitry", ESSCIRC 2002, pp. 143-146.

(Continued)

*Primary Examiner* — Levi Gannon
(74) *Attorney, Agent, or Firm* — Ramin Mobarhan

(57) ABSTRACT

A resonator of a VCO includes a fine tuning main varactor circuit, an auxiliary varactor circuit, and a coarse tuning capacitor bank circuit coupled in parallel with an inductance. The main varactor circuit includes a plurality of circuit portions that can be separately disabled. Within each circuit portion is a multiplexing circuit that supplies a selectable one of either a fine tuning control signal (FTAVCS) or a temperature compensation control signal (TCAVCS) onto a varactor control node within the circuit portion. If the circuit portion is enabled then the FTAVCS is supplied onto the control node so that the circuit portion is used for fine tuning. If the circuit portion is disabled then the TCAVCS is supplied onto the control node so that the circuit portion is used to combat VCO frequency drift as a function of temperature. How the voltage of the TCAVCS varies with temperature is digitally programmable.

42 Claims, 14 Drawing Sheets

U.S. PATENT DOCUMENTS

| | | |
|---|---|---|
| 2007/0188249 A1 | 8/2007 | Abadeer et al. |
| 2007/0222528 A1 | 9/2007 | Pernia et al. |
| 2008/0042765 A1 | 2/2008 | Tarng et al. |
| 2008/0136544 A1 | 6/2008 | Tang |
| 2008/0174379 A1 | 7/2008 | Chen |
| 2009/0121795 A1* | 5/2009 | Kodama ........................ 331/25 |
| 2009/0261917 A1 | 10/2009 | Taghivand et al. |

OTHER PUBLICATIONS

International Search Report and Written Opinion—PCT/US2011/054971—ISAEPO—May 3, 2012.

* cited by examiner

TEMPERATURE COMPENSATION BY
AUXILIARY VARACTOR
(2009/026917)

TEMPERATURE COMPENSATION BY REVERSE
BIASED DIODES IN COARSE TUNING CIRCUIT
(USP7116183)

ONE PORTION (LSB) OF THE
MAIN VARACTOR CIRCUIT

| SIZE CONTROL BIT | VTUNE RANGE | V1(T) RANGE | CAPACITANCE BETWEEN NODES N3 AND N4 |
|---|---|---|---|
| S1[1]=1 | 0.3V-1.80V | X | 10fF-30fF (FUNCTION OF VTUNE) |
| S1[1]=0 | X | 0.3V-1.4V | 7fF-13fF (FUNCTION OF V1(T)) |

ONE PORTION (LSB) OF THE
MAIN VARACTOR CIRCUIT

MAIN VARACTOR CIRCUIT CONTROL

| VCO FREQ. | MAIN VARACTOR SIZE | TEMPCO CODE |
|---|---|---|
| F4 (5.0 GHZ) | S1[1-3]=000 | TC1[1-2]=00 |
| F3 (4.1 GHZ) | S1[1-3]=001 | TC1[1-2]=01 |
| F2 (3.3 GHZ) | S1[1-3]=010 | TC1[1-2]=10 |
| F1 (2.5 GHZ) | S1[1-3]=111 | TC1[1-2]=11 |

MAIN VARACTOR CIRCUIT CONTROL

AUXILIARY VARACTOR CIRCUIT
CONTROL

| VCO FREQ. | AUXILIARY VARACTOR SIZE | TEMPCO CODE | NOMINAL CAPACITANCE | CAPACITANCE VARIABILITY AS A FUNCTION V2(T)[1-3] |
|---|---|---|---|---|
| F1 (2.5 GH) | S2[1-3]=111 | TC2[1-2]=11 | 440fF | 400fF - 480fF |
| F2 (3.1 GHZ) | S2[1-3]=100 | TC2[1-2]=11 | 220fF | 200fF - 240fF |
| F3 (4.1 GHZ) | S2[1-3]=010 | TC2[1-2]=11 | 110fF | 100fF - 120fF |
| F4 (5.0 GHZ) | S2[1-3]=001 | TC2[1-2]=11 | 55fF | 50fF - 60fF |

AUXILIARY VARACTOR CIRCUIT
CONTROL

COARSE TUNING CAPACITOR BANK CIRCUIT

| VCO FREQ. | COARSE TUNING CAP BANK SIZE | TEMPCO CODE | OFF CAPACITANCE | OFF CAPACITANCE VARIABILITY AS A FUNCTION V3(T)[1-3] |
|---|---|---|---|---|
| F1 (2.5 GHZ) | S3[1-3]=111 | TC3[1-2]=11 | NONE | NONE |
| F2 (3.3 GHZ) | S3[1-3]=101 | TC3[1-2]=11 | 250fF | 240fF - 260fF |
| F3 (4.1 GHZ) | S3[1-3]=011 | TC3[1-2]=11 | 500fF | 480fF - 520fF |
| F4 (5.0 GHZ) | S3[1-3]=000 | TC3[1-2]=11 | 1000fF | 960fF - 1040fF |

COARSE TUNING CAPACITOR BANK CIRCUIT
(THE MAX OFF CAPACITANCE CAN CHANGE WITH TEMPERATURE)

CONTROL VOLTAGE V3(T) OF THE COARSE
TUNING CAPACITOR BANK CIRCUIT

OFF CAPACITANCE OF COARSE TUNING
CAPACITOR BANK CIRCUIT
(S3[1-3]=000)

WIDEBAND TEMPERATURE COMPENSATED RESONATOR AND WIDEBAND VCO

BACKGROUND

1. Technical Field

The present disclosure relates to resonators involving varactors, and more particularly to wideband temperature compensated resonators involving varactors such as resonators usable in wideband Voltage Controlled Oscillators (VCOs).

2. Background Information

Resonators are used in many different types of electronic circuits. One type of resonator involves an inductive element coupled in parallel with a capacitive element. An application of such a resonator is a Voltage Controlled Oscillator (VCO) such as a VCO found in a Phase-Locked Loop (PLL). FIG. 1 (Prior Art) is a diagram of one such type of VCO 31. VCO 301 generates an oscillating VCO output signal. In the illustrated example, the oscillating VCO output signal is a differential sinusoidal signal involving signal VOUT− on conductor 302 and VOUT+ on conductor 303. The frequency of the oscillating VCO output signal is determined by a multi-bit digital coarse tune control word received on conductors 304 as well as a fine tune analog control signal VTUNE received on conductor 305. Assuming that the digital control word is fixed, the frequency of the oscillating VCO output signal can be fine tuned up and down by appropriately increasing or decreasing the analog input signal VTUNE.

FIG. 2 (Prior Art) is a more detailed diagram of one example of such a VCO. The resonator tank 306 involves an inductor 307 coupled in parallel with capacitive elements. One of the capacitive elements is a programmable capacitor bank 308. A second of the capacitive elements is a main varactor circuit 309. In one example, the main varactor circuit 309 is a programmable varactor that involves multiple varactor sub-circuits. Individual ones of the varactor sub-circuits can be disabled to decrease the effective tunable capacitance of the programmable varactor element. See U.S. Pat. No. 7,612,626 for additional information on this type of programmable varactor. The remaining transistors 310-313 of the VCO of FIG. 2 form an amplifier. If the digital control word supplied to the VCO is fixed, and if the VTUNE analog input voltage as supplied to the VCO is fixed, then it is desired that the open loop oscillating frequency of the VCO output signal VOUT+, VOUT− be a fixed frequency. Unfortunately, the open loop oscillating frequency of the VCO output signal is seen to change with temperature. The oscillating frequency may, for example, drop as temperature increases. This is undesirable.

FIG. 3 (Prior Art) is a circuit diagram of one conventional VCO circuit 314 that has circuitry for removing the temperature dependent nature of changes in the open loop oscillating frequency of the VCO output signal of the VCO. In addition to the main varactor 315 and the coarse tuning capacitor bank 316, an auxiliary varactor 317 is provided. For additional detail on such an auxiliary varactor, see U.S. Patent Application Publication US2009/0261917. Rather than auxiliary varactor 317 receiving the VTUNE signal such that the capacitance of the auxiliary varactor is adjusted as a function of VTUNE, the auxiliary varactor is made to receive an analog control voltage VCOMP instead. VCOMP is a control voltage generated by a temperature compensating voltage generating circuit 318. VCOMP is made to change as a function of temperature so that the resulting changes in the capacitance of the auxiliary varactor 317 tend to counter the other temperature dependent effects of the remainder of the VCO on VCO output signal frequency. As a result, the open-loop frequency drift of the oscillating frequency of the VCO as a function of temperature can be reduced.

FIG. 4 (Prior Art) is a circuit diagram of another conventional VCO circuit 319 that has circuitry for preventing frequency drift of the oscillating frequency of the VCO. The coarse tuning capacitor bank 320 involves multiple portions 321-323. The circuitry an individual portion of the capacitor bank can be enabled to switch in a capacitance in parallel with inductor 324, or the circuitry of the individual portion can be disabled so that the capacitance is not coupled in parallel with the inductor. Circuitry is provided so that in a disabled condition, the degree of reverse biasing of parasitic diodes of the disabled portion can be adjusted, thereby allowing the capacitance of the disabled portion to be adjusted as a function of temperature. By proper adjusting of the analog control voltage VCOMP supplied to disabled portions, the open-loop frequency drift of the VCO as a function of temperature can be reduced. For additional detail, see U.S. Pat. No. 7,116,183. The amount of temperature compensation afforded is a function of the number of portions of the capacitor bank that are disabled at a given time. At low frequencies, when all the portions 321-323 of the capacitor bank are used, there is no temperature compensation.

SUMMARY

A temperature compensated resonator within a wideband Voltage Controlled Oscillator (VCO) includes a fine tuning main varactor circuit, an auxiliary varactor circuit, and a coarse tuning capacitor bank circuit. These circuits are coupled together in parallel with an inductance. Individual circuit portions of the main varactor circuit can be enabled or disabled under digital control (for example, under the control of digital control bits S1[1-3]). Individual circuit portions of the auxiliary varactor circuit can be enabled or disabled under digital control (for example, under the control of digital control bits S2[1-3]). Individual circuit portions of the coarse tuning capacitor bank circuit can be enabled or disabled under digital control (for example, under the control of digital control bits S3[1-3]).

Within each main varactor circuit portion is a multiplexing circuit that supplies a selectable one of either a Fine Tuning Analog Voltage Control Signal (FTAVCS) or a first Temperature Compensation Analog Voltage Control Signal (TCAVCS) onto a control node of the main varactor circuit portion. The FTAVCS may be the VTUNE voltage control signal received from the loop filter of a Phase-Locked Loop (PLL) of which the VCO is a part. If the main varactor circuit portion is enabled (for example, by an appropriate one of the digital control bits S1[1-3]) then the FTAVCS is supplied onto the control node so that the main varactor circuit portion is used for fine tuning of the oscillating frequency of the VCO. If the main varactor circuit portion is disabled then the first TCAVCS signal (for example, V1(T)) is supplied onto the control node so that the main varactor circuit portion is used to combat VCO frequency drift as a function of temperature. How the voltage of the first TCAVCS signal varies with temperature is digitally programmable (for example, by appropriate setting of the digital control bits TC1[1-2]). For example, the slope of the change in the voltage of V1(T) as a function of temperature can be digitally programmed to have one several different slopes.

In the auxiliary varactor circuit, the control nodes of any enabled auxiliary varactor circuit portions are supplied with a second temperature compensation analog control voltage (for example, V2(T)). How the voltage of this second temperature compensation analog control voltage signal varies with temperature is digitally programmable (for example, by setting of the digital control bits TC2[1-2]). The control nodes of any auxiliary varactor circuit portions that are disabled are supplied with another temperature compensation analog control voltage signal. In one example, the other temperature compensation analog control voltage signal supplied onto the control nodes of disabled auxiliary varactor circuit portions is the same first TCAVCS signal (for example, V1(T)) that is supplied onto the control nodes of disabled main varactor circuit portions.

The individual portions of the coarse tuning capacitor bank circuit can be enabled or disabled. In one example, each capacitor bank circuit portion includes a pair of capacitors and an intervening switching transistor. If the capacitor bank circuit portion is enabled (for example, by an appropriate one of the digital control bits S3[1-3]), then the switching transistor is controlled to be on such that the capacitors are coupled together in series between two nodes of the resonator. How many of the capacitor bank circuit portions are enabled in this way determines how the capacitance of the coarse tuning capacitor bank is set. If the coarse tuning capacitor bank circuit portion is disabled, then a third temperature compensation analog control voltage (for example V3(T)) is supplied onto the source and drain of the switching transistor. The magnitude of this control voltage is usable to adjust a parasitic capacitance of reverse biased source and drain PN junctions of the switching transistor. By adjusting the third temperature compensation analog control voltage appropriately as a function of temperature, the capacitance of the disabled capacitor bank circuit portions is made useful in combating VCO frequency drift as a function of temperature. How the third temperature compensation analog control voltage varies with temperature is digitally programmable (for example, by setting of the digital control bits TC3[1-2]).

Accordingly, in one example, all disabled main varactor circuit portions, all disabled auxiliary varactor circuit portions, and all disabled capacitor bank circuit portions are usable for temperature compensation purposes. By appropriate control of which main varactor circuit portions are enabled, which auxiliary varactor circuit portions are enabled, which capacitor bank circuit portions are enabled, and how the temperature compensation analog voltages V1(T), V2(T) and V3(T) vary as a function of temperature, a VCO of which the resonator is a part is made to have an output signal oscillating frequency variation over temperature (−30 degrees Celsius to +110 degrees Celsius) of less than plus or minus 0.02 percent for any VCO output frequency in a wideband frequency range from 2.5 GHz to 5.0 GHz. Because all varactors coupled to the resonator tank nodes that are not used for tuning are usable for temperature compensation, no extra capacitance must be added just for temperature compensation. Accordingly, there is less parasitic capacitance on the resonator tank nodes and this reducing of parasitic capacitance on the resonator tank nodes facilitates increased tuning range.

In one example, digital control values for controlling the resonator are determined by a processor on a digital baseband processor integrated circuit. The digital control values are values specific for the frequency range in which the VCO is to be operating. These determined digital control values are communicated from the digital baseband integrated circuit to an RF transceiver integrated circuit and then to the resonator within the transceiver integrated circuit. The digital control values are values of a multi-bit digital control word. Some of the digital control values enable and disable selected circuit portions of the main varactor circuit, the auxiliary varactor circuit and the capacitor bank circuit. Others of the digital control values set how the analog control voltages V1(T), V2(T) and V3(T) vary as a function of temperature. For each frequency range of the VCO oscillating frequency, there is a corresponding set of digital control values that controls the resonator for optimal VCO performance. In one embodiment, these sets of digital control values in association with information on the VCO frequency range corresponding to each set is stored in a processor-readable medium within the digital baseband processor integrated circuit.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 5:
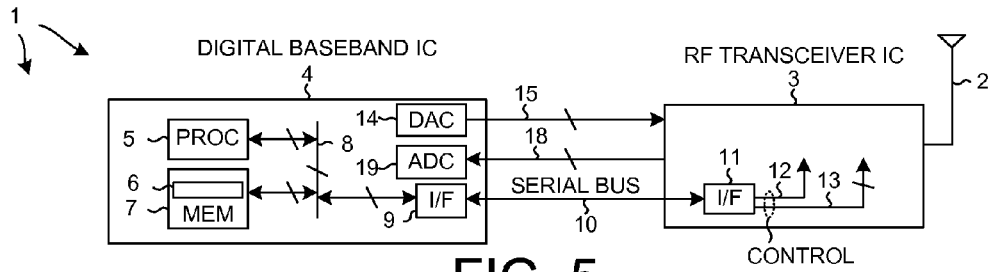
FIG. 5 is a diagram of a mobile communication device that includes a wideband temperature compensated resonator tank in accordance with one novel aspect.

FIG. 5 is a diagram of a mobile communication device 1 that includes a wideband temperature compensated resonator tank in accordance with a first novel aspect. In this example, mobile communication device 1 is a multi-band cellular telephone handset. Device 1 includes (among other parts not illustrated) an antenna 2 usable for receiving and transmitting cellular telephone communications, an RF (Radio Frequency) transceiver integrated circuit 3, and a digital baseband processor integrated circuit 4. In some examples, the transceiver circuitry and the digital baseband circuitry are implemented on the same integrated circuit, but a two integrated circuit implementation is set forth here for illustration purposes.

Digital baseband integrated circuit 4 includes a processor 5 that executes a program 6 of processor-executable instructions. Program 6 is stored in a processor-readable medium 7 that in this case is a semiconductor memory. Processor 5 accesses memory 7 via a local bus mechanism 8. Processor 5 interacts with and controls the RF transceiver integrated circuit 3 by sending control information to integrated circuit 3 via serial bus interface 9, serial bus 10, serial bus interface 11, and groups of control conductors 12 and 13. Information to be transmitted is converted into digital form on digital baseband processor integrated circuit 4 by a Digital-to-Analog Converter (DAC) 14 and is communicated across conductors 15 to the transmitter portion 16 of transceiver integrated circuit 3. Data received by the receive chain portion 17 of transceiver integrated circuit 3 is communicated in the opposite direction across conductors 18 from RF transceiver integrated circuit 3 to digital baseband processor integrated circuit 4 and is converted into digital form by an Analog-to-Digital Converter (ADC) 19.

Figure 1:
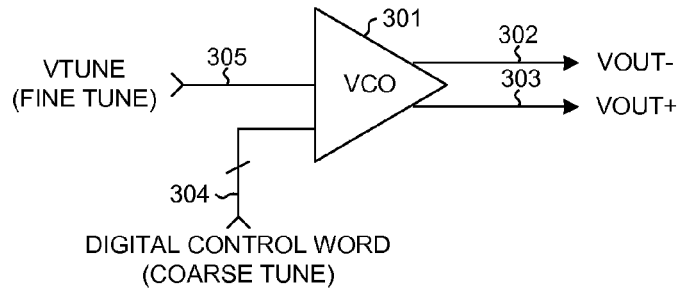
FIG. 1 (Prior Art) is a diagram of a conventional VCO.
Figure 2:
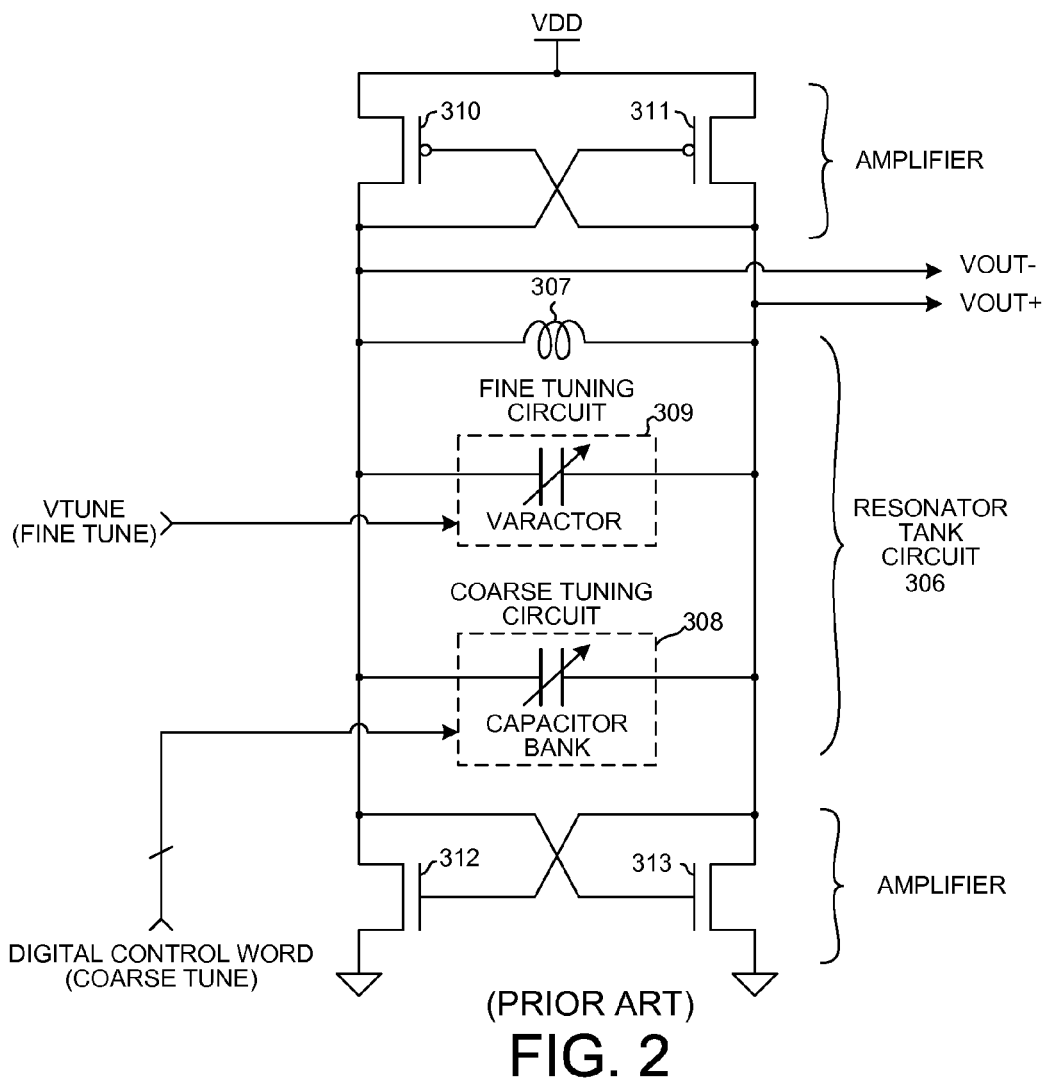
FIG. 2 (Prior Art) is a circuit diagram of the VCO of FIG. 1.
Figure 6:
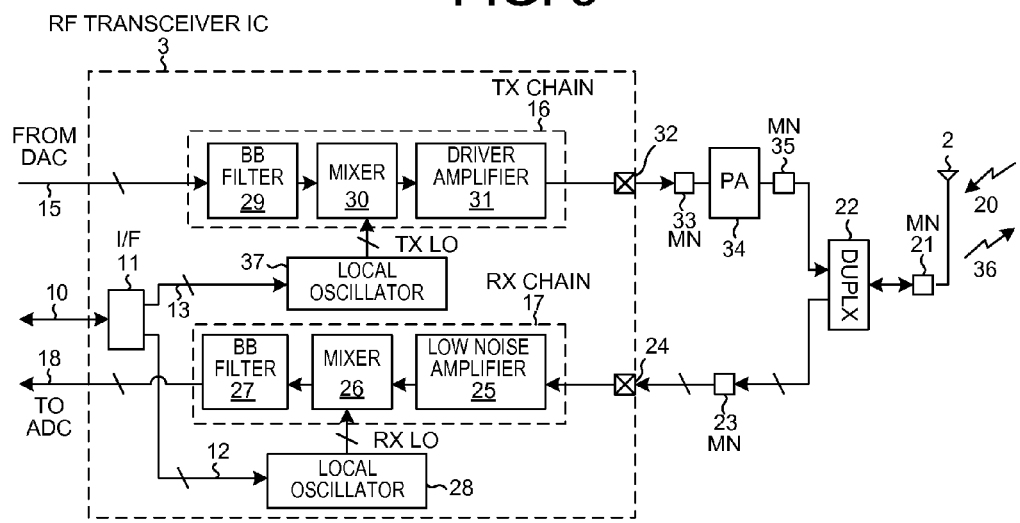
FIG. 6 is a more detailed diagram of the transceiver and antenna parts of the mobile communication device of FIG. 5.

FIG. 6 is a more detailed diagram of the transceiver and antenna parts of the cellular telephone of FIG. 5. In one very simplified explanation of the operation of the cellular telephone, if the cellular telephone of FIG. 1 is being used to receive information, then an incoming transmission 20 is received on antenna 2. The incoming signal passes through matching network 21, a duplexer 22, a matching network 23, terminals 24, a Low Noise Amplifier (LNA) 25, a mixer 26, a baseband filter 27, and conductors 18 to the ADC 19 within digital baseband processor integrated circuit 4. A local oscillator 28 (also referred to as a frequency synthesizer) supplies a receive local oscillator signal RX LO to the mixer 26. How the receiver downconverts is controlled by changing the frequency of the local oscillator signal RX LO.

If, on the other hand, cellular telephone 1 is being used to transmit information, then the information to be transmitted is converted into analog form by DAC 14 in digital baseband processor integrated circuit 4. The analog information is supplied to a baseband filter 29 of the transmit chain portion 16 of the RF transceiver integrated circuit 3. After filtering by the baseband filter, the signal is upconverted in frequency by a mixer 30. The upconverted signal passes through driver amplifier 31, terminal 32, matching network 33, power amplifier 34, matching network 35, duplexer 22, and to antenna 2 for transmission as transmission 36. How mixer 30 upconverts is controlled by changing the frequency of the local oscillator signal TX LO generated by local oscillator 37 (also referred to as a frequency synthesizer).

Figure 7:
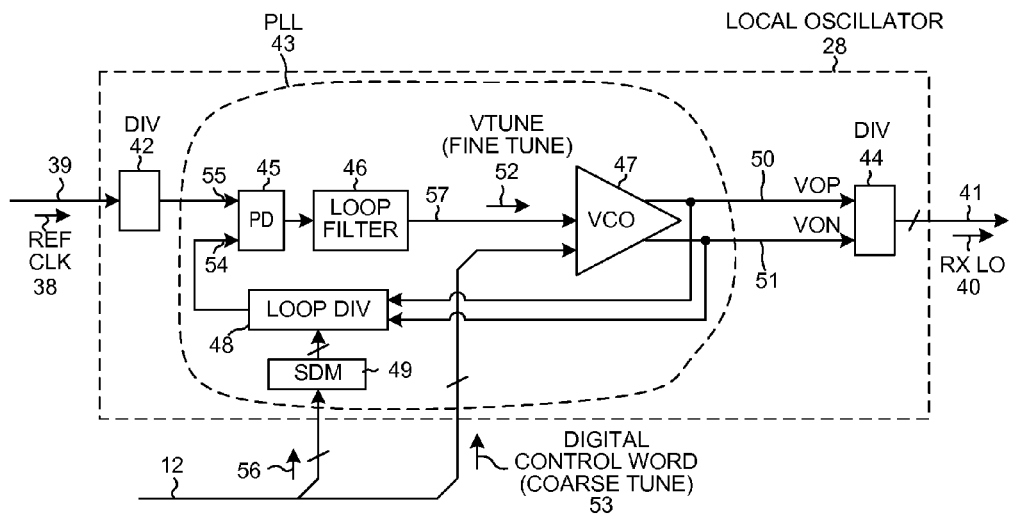
FIG. 7 is a more detailed diagram of a local oscillator in the RF transceiver integrated circuit of FIG. 6.

FIG. 7 is a more detailed diagram of the local oscillator 28 of the RF transceiver integrated circuit 3 of FIG. 6. Local oscillator 28 receives a reference clock signal REF CLK 38 from a reference clock source via conductor 39. Local oscillator 28 outputs the RX LO signal 40 onto conductors 41. Local oscillator 28 includes a divider 42, a Phase-Locked Loop (PLL) 43, and an output divider 44. In this case the PLL 43 is an analog PLL and includes a phase detector 45, a loop filter 46, a VCO 47, a loop divider 48, and a Sigma-Delta Modulator (SDM) 49. The VCO 47 supplies a sinusoidal analog differential VCO output signal VOP and VON onto conductors 50 and 51, respectively. The oscillating frequency of the output signal of the VCO is determined by an analog input signal VTUNE 52 and a multi-bit digital control word 53. When the PLL is in lock, the analog input signal VTUNE is adjusted by the loop filter 46 so that the phase of the VCO output signal, as divided down by loop divider 48 and supplied back onto a second input lead 54 of phase detector 45 matches the phase of the reference clock signal REF CLK as divided down by divider 42 and supplied onto a first input lead 55 of phase detector 45. The fine tuning VTUNE signal 52 ranges from approximately 0.5 volts to 2.0 volts. Coarse tuning digital control word 53 is part of a larger coarse tuning digital control word carried on control conductors 12. Arrow 56 represents a portion of the larger coars tuning digital control word that is supplied to the Sigma-Delta Modulator 49 of the PLL.

Figure 8:
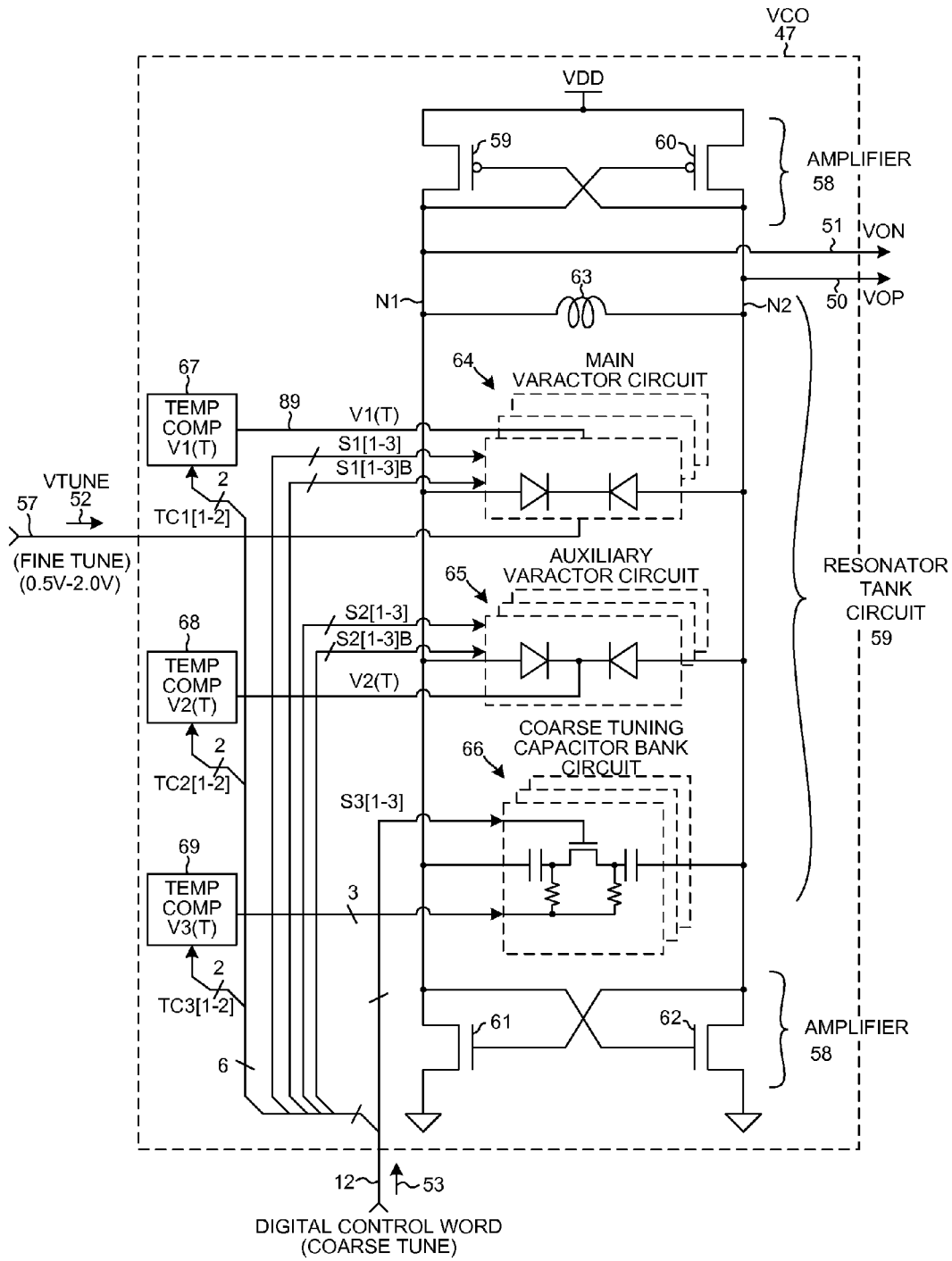
FIG. 8 is a more detailed diagram of the VCO in the local oscillator of FIG. 7.

FIG. 8 is a more detailed diagram of VCO 47 of FIG. 7. VCO 47 receives the fine tuning signal VTUNE 52 via conductor 57 from the loop filter 46. VTUNE is also referred to as the "Fine Tuning Analog Voltage Control Signal" (FTAVCS). VCO 47 receives the coarse tuning multi-bit digital control word 53 via conductors 12 from the serial bus interface 11. VCO 47 outputs the VCO output signal involving signal VOP on node N2 and involving signal VON on node N1. The VCO output signal (VOP and VON) on nodes N2 and N1 is output via conductors 50 and 51. VCO 47 includes an amplifier portion 58 and a resonator tank portion 59. Amplifier portion 58 in this particular example includes two cross-coupled P-channel transistors 59 and 60 and two cross-coupled N-channel transistors 61 and 62 as illustrated. Resonator tank portion 59 includes an inductor 63, a main varactor circuit 64, a first temperature compensation circuit 67, an auxiliary varactor circuit 65, a second temperature compensation circuit 68, a coarse tuning capacitor bank circuit 66, and a third temperature compensation circuit 69. Inductor 63, main varactor circuit 64, auxiliary varactor circuit 65, and coarse tuning capacitor bank circuit 66 are coupled together in parallel between nodes N1 and N2.

Although not shown in FIG. 8, there may be an additional buffer disposed in the signal path between the nodes N1 and N2 of the resonator tank circuit 59 and the output of the VCO. Such a buffer, although not shown here, would be located within the VCO triangle symbol 47 of FIG. 7. Temperature compensation voltage generating circuit 67 may involve one of any number of well known conventional circuits for generating a voltage $V1(T)$ that varies with temperature. In one example, the structure of circuit 67 includes a conventional PTAT (Proportional To Absolute Temperature) circuit coupled to a conventional bandgap circuit, where the relative strengths of the two circuits is weighted as determined by digital value TC1[1-2] such that the slope of a combined output voltage versus temperature is digitally programmable and is a function of TC1[1-2].

Figure 9:
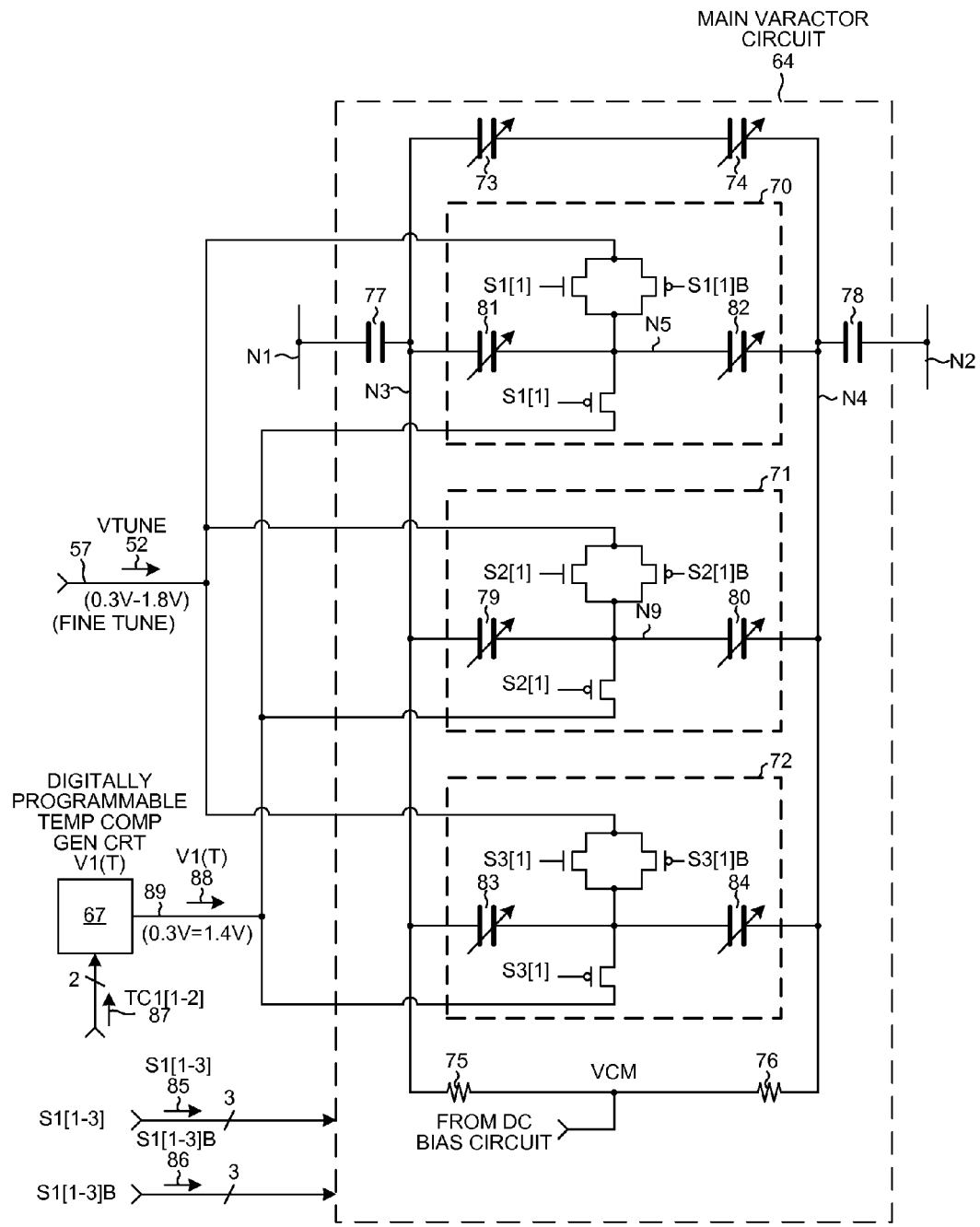
FIG. 9 is a more detailed diagram of the main varactor circuit in the VCO of FIG. 8.

FIG. 9 is a more detailed diagram of main varactor circuit 64 of FIG. 8. Main varactor circuit 64 includes a plurality of main varactor circuit portions 70-72, two additional varactors 73 and 74, and two DC bias voltage resistors 75 and 76. VCM stands for common mode voltage. VCM is a DC bias voltage. The main varactor circuit portions 70-72 are coupled together in parallel between conductors N3 and N4 as illustrated. Conductor and node N3 is AC coupled to conductor and node N1 by capacitor 77. Conductor and node N4 is AC coupled to conductor and node N2 by capacitor 78. The cross-coupled transistors of the amplifier portion of the VCO (see FIG. 8) may put a DC bias voltage on nodes N1 and N2. This DC bias should not be imposed on the varactors of the main varactor circuit. Capacitors 77 and 78 are therefore provided to block this DC bias voltage from reaching nodes N3 and N4. In other embodiments, however, the AC coupling capacitors 77 and 78 are not provided. Rather conductor and node N3 is directly connected (DC coupled) to conductor and node N1 so that N3 and N1 are really one node. Similarly, conductor and node N4 is directly connected (DC coupled) to conductor and node N2 so that N4 and N2 are really one node.

The main varactor circuit portions 70-72 are of similar construction except that the sizes of the varactors in the main varactor circuit portions can be made (for example) to increase in a binary weighted fashion such that varactors 79 and 80 are twice as large as varactors 81 and 82, and such that varactors 83 and 84 are twice as large as varactors 79 and 80. Three digital control bits S1[1-3] 85 and their complements S1[1-3]B 86 are bits of the digital control word 53 of FIG. 8. These bits S1[1-3] and S1[1-3]B are supplied to the main varactor circuit portions as illustrated. The digital values of these digital bits determine which ones of the main varactor circuit portions are enabled and disabled. In addition to receiving digital control bits S1[1-3] and S1[1-3]B, the main varactor circuit 64 receives two other digital control bits TC1[1-2] 87. Digital control bits TC1[1-2] are also bits of the digital control word 53 of FIG. 8. The values of the digital control bits TC1[1-2] determine how the voltage of a voltage control signal V1(T) 88 varies with temperature. Signal V1(T) 88 is generated by temperature compensation voltage generating circuit 67 and is supplied to the main varactor circuit portions via conductor 89 as illustrated.

Figures 10, 11:
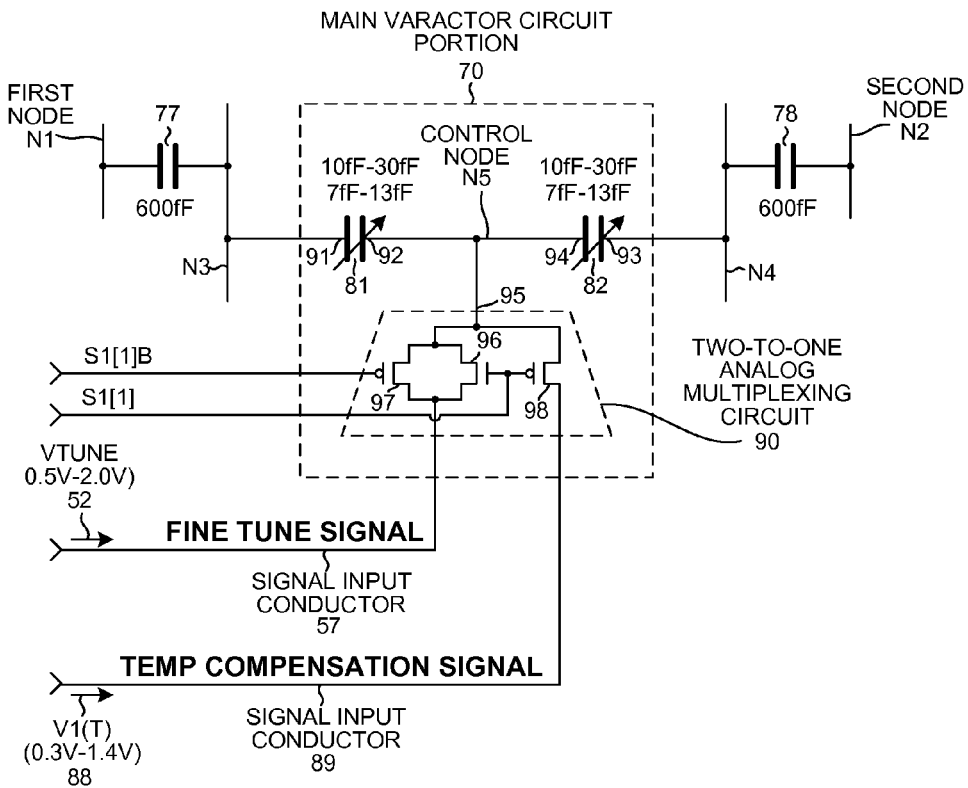
FIG. 10 is a more detailed diagram of one of the main varactor circuit portions of the main varactor circuit of FIG. 9.
FIG. 11 is a table that sets forth an operation of the main varactor circuit portion of FIG. 10.

FIG. 10 is a circuit diagram of one of the main varactor circuit portions 70. Main varactor circuit portion 70 includes varactors 81 and 82 and a multiplexing circuit 90. A first lead 91 of varactor 81 is coupled to node N3 and a second lead 92 of varactor 81 is coupled to control node N5. A first lead 93 of varactor 82 is coupled to node N4 and a second lead 94 of varactor 82 is coupled to control node N5. Multiplexing circuit 90 couples a selected one of fine tuning analog signal VTUNE and temperature compensation analog signal V1(T) onto control node N5. Reference numeral 95 represents an output lead of multiplexing circuit 90. The multiplexing circuit 90 can be realized and laid out in different ways and the multiplexing circuit 90 need not be connected to control node N5 by a single lead as shown. The diagram of FIG. 10 is just one example presented here for illustrative purposes. An N-channel transistor or a transmission gate or another suitable circuit may be used in place of P-channel transistor 98. Which of the signals VTUNE and V1(T) multiplexing circuit 90 supplies onto control node N5 is determined by the value of digital control bits S1[1] and S1[1]B. If S1[1] is a digital logic high, then N-channel transistor 96 is on and P-channel transistor 98 is off. If S1[1] is a digital logic high then S1[1]B is a digital logic low, so P-channel transistor 97 is on. Transistors 96 and 97 form a transmission gate that is on. The fine tuning signal VTUNE is therefore coupled through the transmission gate onto control node N5. If, on the other hand, S1[1] is a digital logic low, then S1[1]B is a digital logic high and transistor 98 is on and transistors 96 and 97 are off and V1(T) is coupled via conductive transistor 98 onto control node N5. When S1[1] is a digital logic high then the main varactor circuit portion 70 is said to be enabled, whereas if S1[1] is a digital logic low then the main varactor circuit portion 70 is said to be disabled. If the main varactor circuit portion 70 is enabled, then varactors 81 and 82 can have capacitances in the range of from 10 fF to 30 fF as determined by the magnitude of VTUNE. If the main varactor circuit portion 70 is disabled, then varactors 81 and 82 can have capacitances in the range of from 7 fF to 13 fF as determined by the magnitude of V1(T).

FIG. 11 is a table that sets forth the operation of main varactor circuit portion 70. The X's in the table indicate don't care conditions. If, for example, S1[1] is a digital logic high as indicated in the upper row of FIG. 11, then the transistor 98 is off and the voltage of V1(T) does not matter to the operation of the main varactor circuit portion 70. Similarly, if S1[1] is a digital logic low as indicated in the lower row of FIG. 11, then the transistors 96 and 97 are off and the voltage of VTUNE does not matter to the operation of the main varactor circuit portion 70.

Figures 12, 13:
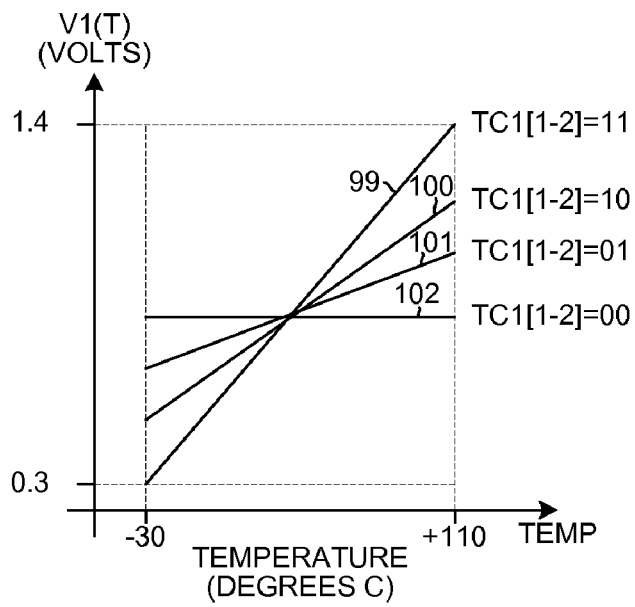
FIG. 12 is a chart that shows how analog control voltage V1(T) varies as a function of temperature.
FIG. 13 is a table that shows how the digital control bits S1[1-3] and TC1[1-2] are set to control the main varactor circuit of FIG. 9.

FIG. 12 is a chart that illustrates how V1(T) is made to change as a function of temperature over a temperature range from −30 degrees Celsius to +110 degrees Celsius. How V1(T) changes as a function of temperature is digitally programmable by setting the digital control bits TC1[1-2] appropriately. Lines 99-101 represent the relationship of the voltage of V1(T) to temperature for TC1[1-2] values of 11, 10, 01 and 00, respectively.

FIG. 13 is a table that shows how the S1[1-3] bits and the TC1[1-2] bits are set for different VCO output frequency ranges in the one specific embodiment of FIG. 8. Enabled main varactor circuit portions are used for fine tuning (dependent upon VTUNE) whereas disabled main varactor circuit portions are used to combat VCO frequency drift with temperature (dependent upon V1(T)).

Figure 14:
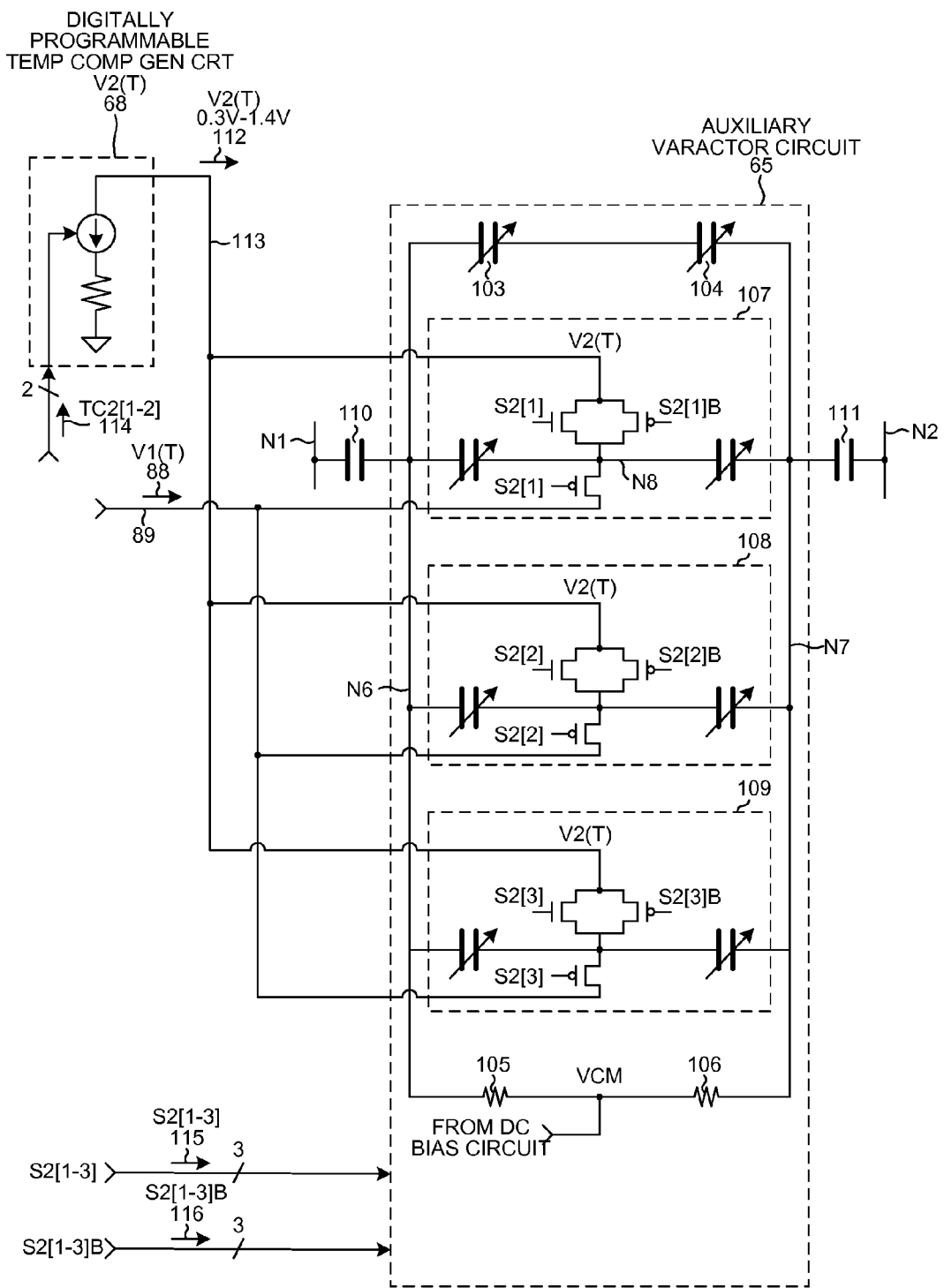
FIG. 14 is a more detailed diagram of the auxiliary varactor circuit of the VCO of FIG. 8.

FIG. 14 is a circuit diagram of the auxiliary varactor circuit 65 of FIG. 8. Auxiliary varactor circuit 65 includes varactors 103 and 104, DC voltage biasing resistors 105 and 106, and a plurality of auxiliary varactor circuit portions 107-109. The auxiliary varactor circuit portions 107-109 are coupled together in parallel between conductors N6 and N7 as illustrated. Conductor and node N6 is AC coupled to conductor and node N1 by capacitor 110. Conductor and node N7 is AC coupled to conductor and node N2 by capacitor 111. As noted above in connection with the main varactor circuit, the cross-coupled transistors of the amplifier portion of the VCO may put a DC bias voltage on nodes N1 and N2. This DC bias should not be imposed on the varactors of the auxiliary varactor circuit. Capacitors 110 and 111 are provided to block the DC bias voltage from reaching nodes N6 and N7. In other embodiments, however, the AC coupling capacitors 110 and 111 are not provided but rather nodes N6 and N7 are DC coupled directly to nodes N1 and N2, respectively.

The structure of the auxiliary varactor circuit portions 107-109 are similar to the structure of the main varactor circuit portions 70-72, except that where the auxiliary varactor circuit portions receive the analog control voltage V2(T) 112 in place of the VTUNE signal 52 received by the main varactor circuit portions. VTUNE signal 52 is not supplied to the auxiliary varactor circuit 65. V2(T) is generated by the temperature compensation voltage generating circuit 68 and is supplied via conductor 113 to the various auxiliary varactor circuit portions as illustrated. Analog control voltage signal V2(T) has a voltage the varies with temperature. How the voltage of V2(T) varies with temperature is digitally controlled by setting the two digital control bits TC2[1-2] 114 appropriately. Digital control bits TC2[1-2] 114 are two bits of the digital control word 53. Individual ones of the auxiliary varactor circuit portions 107-109 can be enabled or disabled as determined by digital control bits S2[1-3] 115 and S2[1-3]B 116. As in the case of the main varactor circuit portions, each of the auxiliary varactor circuit portions includes a multiplexing circuit that selectively couples one or two signals onto the control node of the auxiliary varactor circuit portion. In the case of the auxiliary varactor circuit portions, the multiplexing circuits either couple the analog control signal V2(T) or the analog control signal V1(T) onto the control node. If the auxiliary varactor circuit portion is enabled then the multiplexing circuit is controlled to couple V2(T) onto the control node, whereas if the auxiliary varactor circuit portion is disabled then the multiplexing circuit is controlled to couple V1(T) onto the control node.

Figures 15, 16:
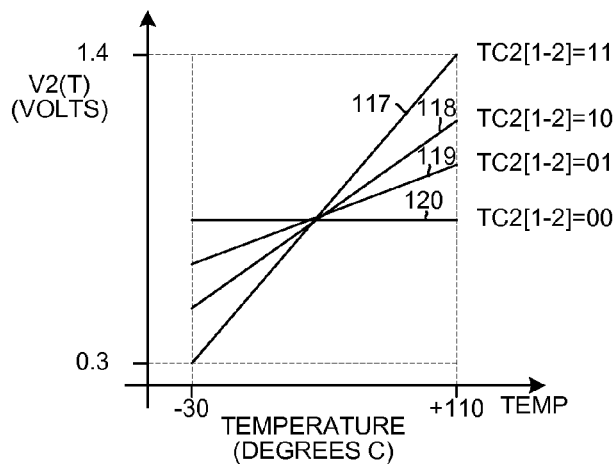
FIG. 15 is a chart that shows how analog control voltage V2(T) varies as a function of temperature.
FIG. 16 is a table that shows how the digital control bits S2[1-3] and TC2[1-2] are set to control the auxiliary varactor circuit of FIG. 9.

FIG. 15 is a chart that illustrates how V2(T) is made to change as a function of temperature over a temperature range from −30 degrees Celsius to +110 degrees Celsius. How V2(T) changes as a function of temperature is digitally programmable by setting the digital control bits TC2[1-2] appropriately. Lines 117-120 represent the relationship of the voltage of V2(T) to temperature for TC2[1-2] values of 11, 10, 01 and 00, respectively.

FIG. 16 is a table that shows how the S2[1-3] bits and the TC2[1-2] bits are set for different VCO output frequency ranges in the one specific embodiment of FIG. 8. The sizes of the varactors in the various auxiliary varactor circuit portions are binary weighted. If only one auxiliary varactor circuit portion is enabled due to S2[1-3]=001, then the nominal capacitance provided by the auxiliary varactor circuit is 55 fF as indicated by the table. If all the auxiliary varactor circuit portions are enabled due to S2[1-3]=111, then the nominal capacitance provided by the auxiliary varactor circuit is 440 fF as indicated by the table. In the particular example illustrated, the way V2(T) changes with temperature as determined by TC2[1-2] is the same for all VCO frequency operating ranges, but the value TC2[1-2] can be set to have a different value for different VCO operating ranges if doing so leads to improved VCO operating performance.

Figures 17, 18:
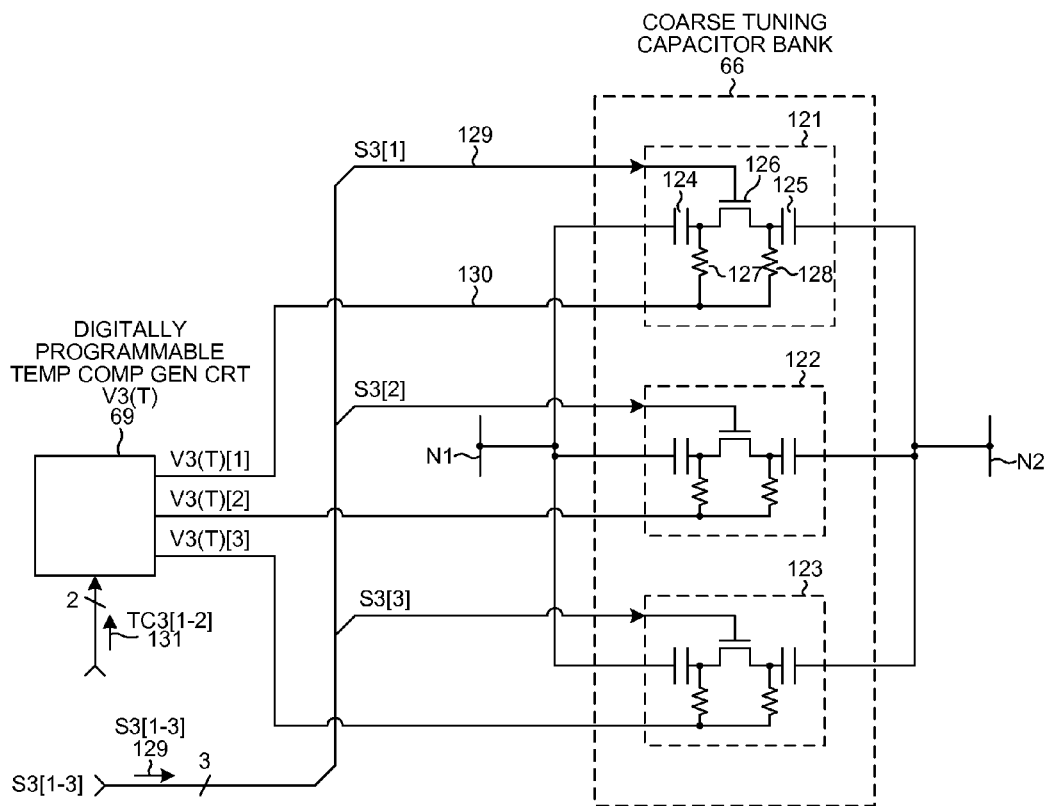
FIG. 17 is a more detailed diagram of the coarse tuning capacitor bank circuit of the VCO of FIG. 8.
FIG. 18 is a table that shows how the digital control bits S3[1-3] and TC3[1-2] are set to control the coarse tuning capacitor bank circuit of FIG. 17.

FIG. 17 is a circuit diagram of the coarse tuning capacitor bank circuit 66 of FIG. 8. Coarse tuning capacitor bank circuit 66 includes a plurality of capacitor bank circuit portions 121-123. Each of the capacitor bank circuit portions is of similar structure so only the internal structure of capacitor bank circuit portion 121 is described here. Capacitor bank circuit portion 121 includes two capacitors 124 and 125, a switching transistor 126, and two resistors 127 and 128. The three digital control bits S3[1-3] 129 determine which ones of the capacitor bank circuit portions are enabled and which ones are disabled. Digital control bit S3[1] on conductor 129 enables or disables capacitor bank circuit portion 121. If S3[1] is a digital logic high, then transistor 126 is on and capacitors 124 and 125 are coupled in series to provide a capacitance between nodes N1 and N2. In this situation of the capacitor bank circuit portion being enabled, the switching transistor 126 is to be fully on and conductive. Accordingly, the voltage on conductor 130 is controlled to be a low voltage such as ground potential. If, however, S3[1] is a digital logic low, then transistor 126 is off. Capacitors 124 and 125 are not coupled in series between nodes N1 and N2. There is, however, nonetheless a capacitance provided between nodes N1 and N2 by the disabled capacitor bank circuit portion 121. The source and the drain of the transistor 126 involve parasitic capacitances due to PN junctions. By increasing or decreasing the voltage on conductor 130, the width of the depletion regions of these parasitic PN junction diodes can be increased or decreased, and this increased or decreased width of the depletion regions results in corresponding increased or decreased parasitic capacitances. The voltage V3(T)[1] on conductor 130 is adjusted as a function of temperature to provide a change in the capacitance between nodes N1 and N2 as a function of temperature. Each of the capacitor bank circuit portions 121-123 receives a corresponding analog control voltage V3(T) for this purpose. The three V3(T)[1-3] signals are generated by temperature compensation voltage generating circuit 69. How the voltage of these signals V3(T)[1-3] varies with temperature is digitally programmable by setting the digital control bits TC3[1-2] 131.

FIG. 18 is a table that shows how the S3[1-3] bits and the TC3[1-2] bits are set for different VCO output frequency ranges in the one specific embodiment of FIG. 8. Enabled capacitor bank portions are used for coarse tuning (dependent upon the digital control word 53) whereas disabled capacitor bank circuit portions are used to combat VCO frequency drift with temperature (dependent upon V3(T)[1-3]).

Figure 19:
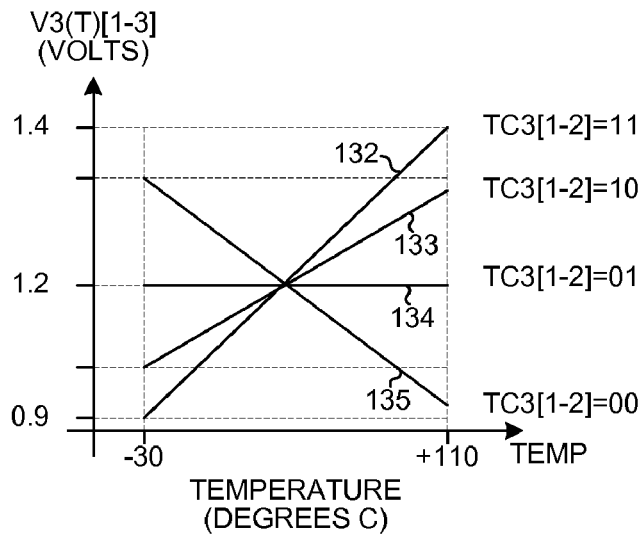
FIG. 19 is a chart that shows how the analog control voltage signals V3(T)[1-3] vary as a function of temperature.

FIG. 19 is a chart that illustrates how the voltage of one representative one of the signals V3(T) signals is made to change as a function of temperature over a temperature range from −30 degrees Celsius to +110 degrees Celsius. Lines 132-135 represent the relationship of the voltage of V3(T)[1] to temperature for TC3[1] values of 11, 10, 01 and 00, respectively.

Figure 20:
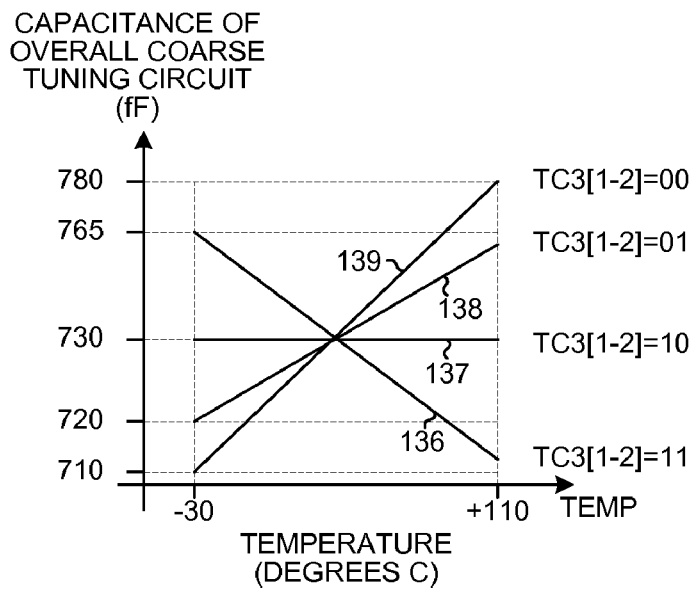
FIG. 20 is a chart that shows how the off capacitance of the coarse tuning capacitor bank circuit of FIG. 17 changes as a function of temperature.

FIG. 20 is a chart that illustrates how the capacitance provided by the capacitor bank circuit portion 121 can be changed as a function of V3(T)[1] when transistor 126 is off. Lines 136-139 represent the off capacitance for TC3[1] values of 11, 10, 01 and 00, respectively. As set forth above, the capacitance is due to depletion regions of the reverse biased parasitic PN junction diodes of the source and drain of transistor 126. Changing V3(T)[1] as a function of temperature causes this off capacitance of disabled capacitor bank circuit portions to change as a function of temperature. How the off capacitance changes as a function of temperature is set to combat VCO frequency drift with temperature.

The determining of how the digital control bits (S1[1-3] and TC1[1-2]) that control the main varactor circuit 64, the determining of how the digital control bits (S2[1-3] and TC2[1-2]) that control the auxiliary varactor circuit 65, and determining of how the digital control bits (S3[1-3] and TC3[1-2]) that control the capacitor bank circuit 66 are not performed in isolation independently of one another. For each VCO output signal frequency range, the combination of control bit values that leads to the best VCO performance is determined and used. In one example, the combination of control bit values (for each VCO output signal frequency range) that is best from a temperature compensation perspective is determined and is stored in processor-readable medium 7 (semiconductor memory) in the digital baseband integrated circuit 4 of FIG. 5. As the cellular telephone handset 1 operates, the processor 5 uses this stored information to determine how the VCO 47 of the local oscillator of the receiver shall be configured. Processor 5 then sends information for setting the digital control word 53 across the serial bus 10 so that the values S1[1-3], S1[1-3]B, S2[1-3], S2[1-3]B, S3[1-3], TC1[1-2], TC2[1-2] and TC3[1-2] will be set appropriately for the VCO output frequency desired.

Figure 3:
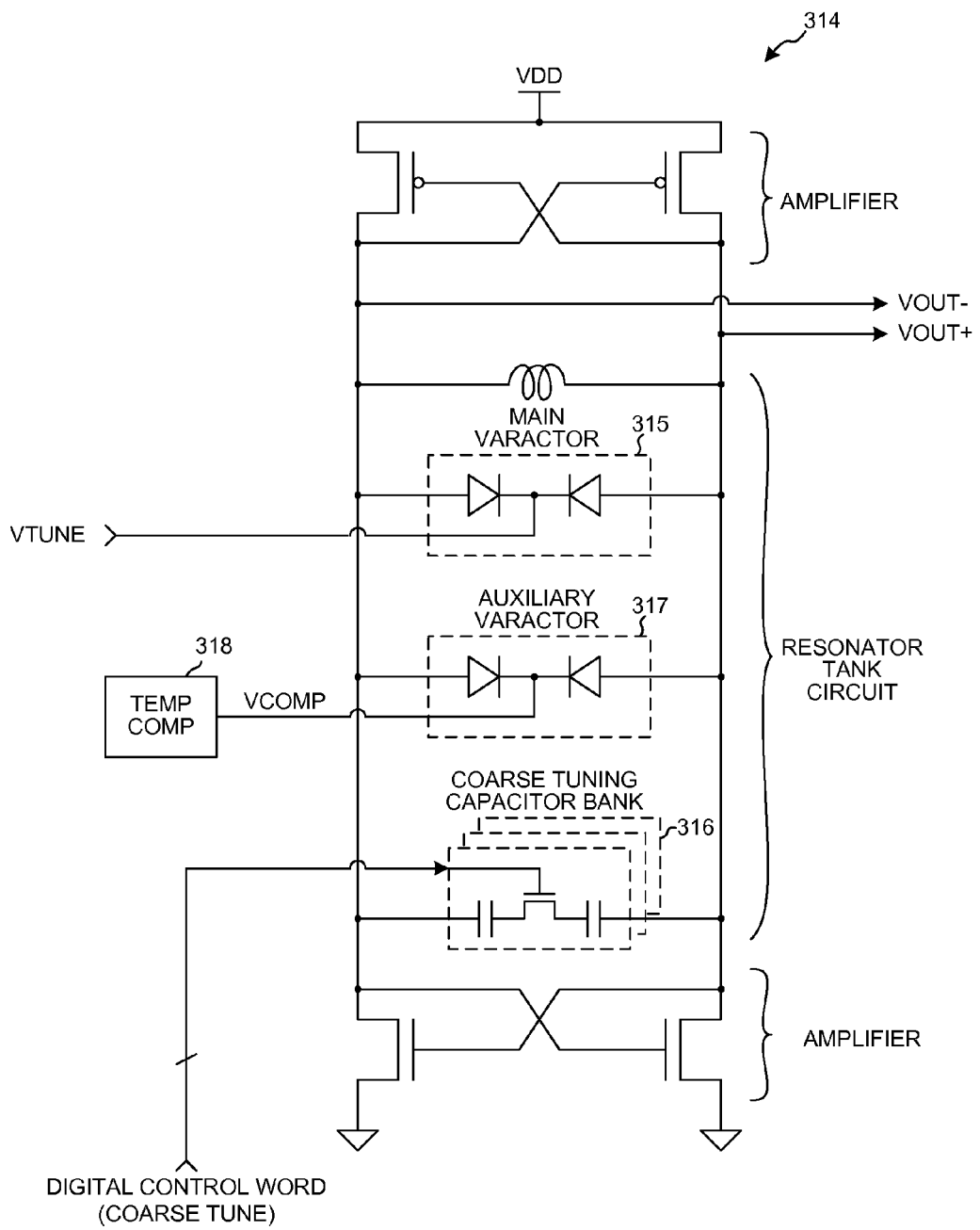
FIG. 3 (Prior Art) is a circuit diagram of a first example of the VCO of FIG. 1.
Figure 4:
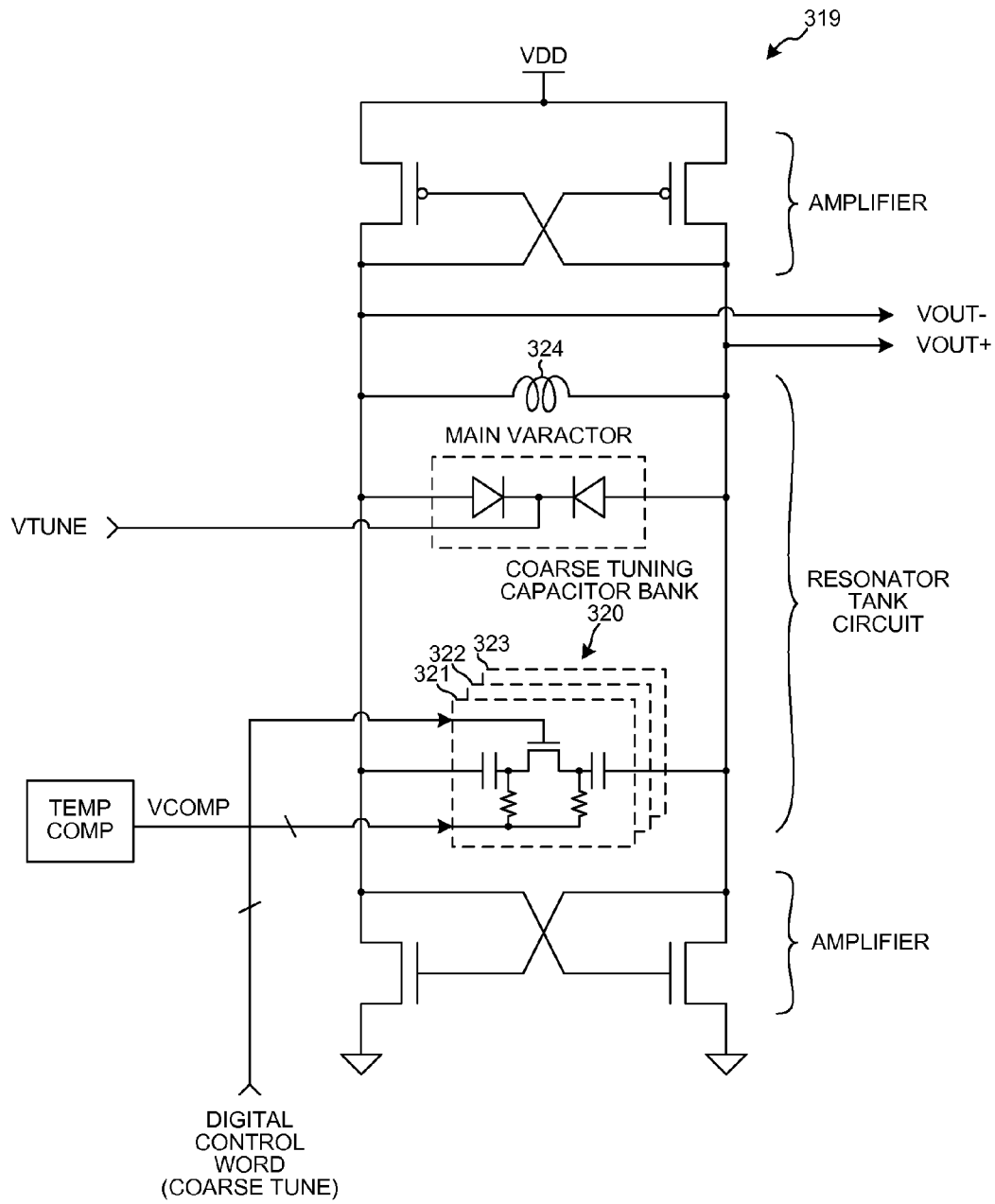
FIG. 4 (Prior Art) is a circuit diagram of a second example of the VCO of FIG. 1.
Figure 21:
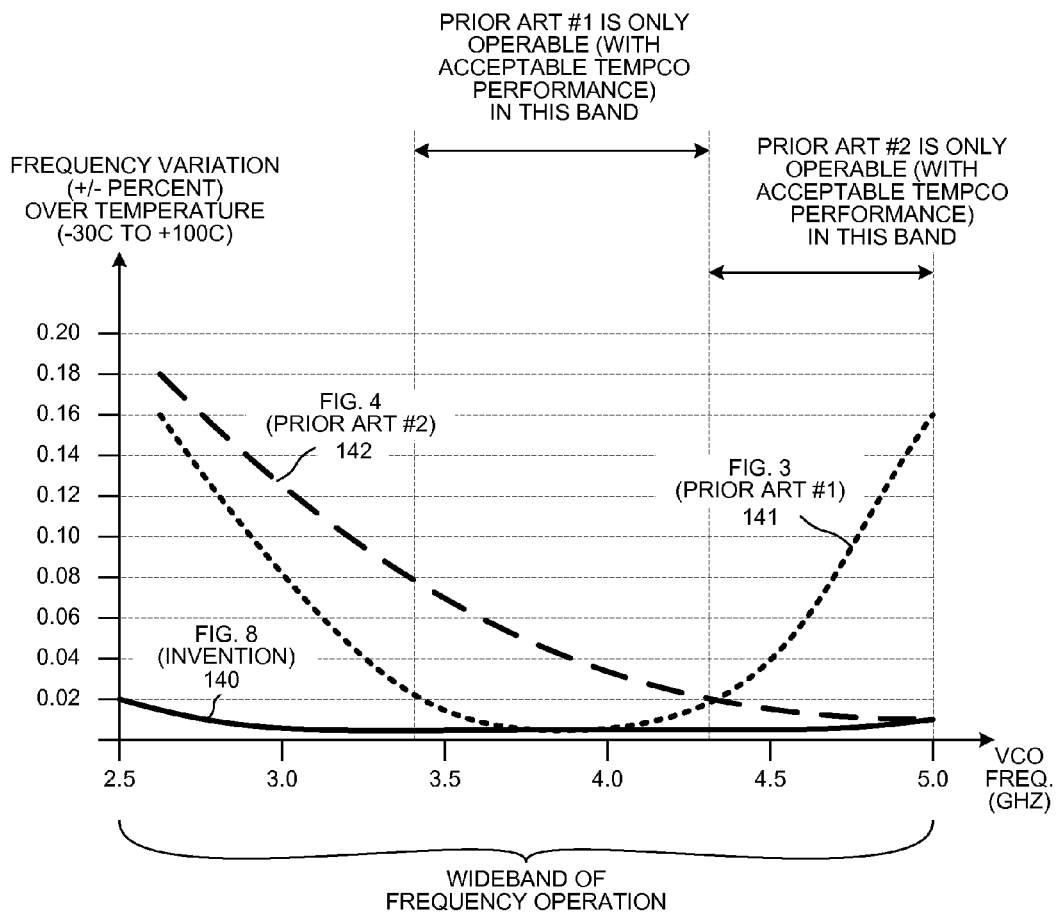
FIG. 21 is a chart that compares the frequency variation over temperature performances of the VCO of FIG. 8, the VCO of FIG. 3 (Prior Art) and the VCO of FIG. 4 (Prior Art).

FIG. 21 is a chart that shows, in the vertical axis, percent variation in the VCO output signal frequency over temperature (−30 degrees Celsius to +110 degrees Celsius). The horizontal axis is VCO output signal frequency. Line 140 represents the operation of the VCO 47 of FIG. 8. The frequency variation of the VCO output signal as a function of temperature is less than plus or minus 0.02 percent for the entire wideband frequency range from 2.5 GHz to 5.0 GHz. Line 141 represents the operation of the VCO of FIG. 3 (Prior Art). Note that the VCO output signal frequency of the VCO of FIG. 3 varies with temperature substantially more than plus or minus 0.02 percent for both low and high VCO output frequencies. Line 142 represents the operation of the VCO of FIG. 4 (Prior Art). Note that the VCO output signal frequency of the VCO of FIG. 4 varies with temperature substantially more than plus or minus 0.02 percent for low and mid-band VCO output frequencies.

Figure 22:
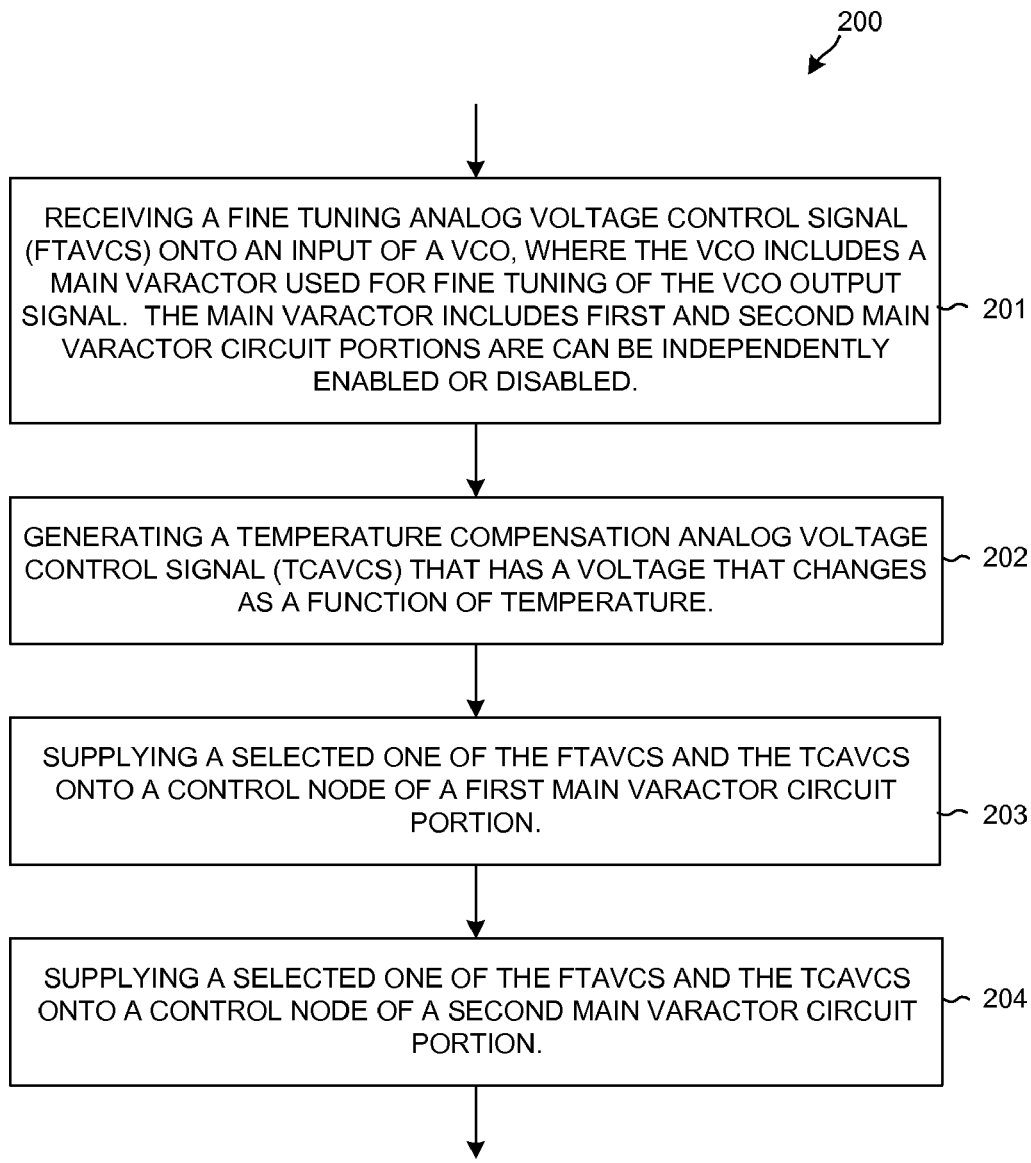
FIG. 22 is a flowchart of a method in accordance with one novel aspect.

FIG. 22 is a flowchart of the method 200 in accordance with one novel aspect. A Fine Tuning Analog Voltage Control Signal (FTAVCS) is received (step 201) onto the fine tuning input lead of a VCO. In one example, the signal FTAVCS is the VTUNE signal 52 that is received via conductor 57 onto the input lead of VCO 47 of FIG. 8. The VCO includes a main varactor circuit used for fine tuning of the frequency of the VCO output signal. The main varactor circuit includes first and second main varactor circuit portions. These portions can be independently enabled or disabled. In one example, the main varactor circuit is main varactor circuit 64 of FIG. 8.

The VCO generates (step 202) a Temperature Compensation Analog Voltage Control Signal (TCAVCS) that has a voltage that changes as a function of temperature. In one example, TCAVCS is signal V1(T) that is generated by the temperature compensation voltage generating circuit 67 of FIG. 8.

A selected one of the FTAVCS and the TCAVCS signals is supplied (step 203) onto a control node of the first main varactor circuit portion. In one example, the first main varactor circuit portion is main varactor circuit portion 70 of FIG. 9 and the control node is control node N5 of FIG. 9.

A selected one of the FTAVCS and the TCAVCS signals is supplied (step 204) onto a control node of the second main varactor circuit portion. In one example, the second main varactor circuit portion is main varactor circuit portion 71 of FIG. 9 and the control node is control node N9 of FIG. 9. In one example of the method, the first and second main varactor circuit portions are independently controlled to be enabled or disabled. If a main varactor circuit portion is enabled then FTAVCS (for example, VTUNE signal 52) is supplied onto its control node, whereas if the main varactor circuit portion is disabled then TCAVCS (for example, signal V1(T)) is supplied onto its control node.

In one novel aspect, a method of manufacturing an integrated circuit involves: forming a fine tuning analog signal input conductor; forming a first varactor and a second varactor such that a lead of the first varactor is coupled to a control node and such that a lead of the second varactor is coupled to the control node; forming an analog multiplexing circuit having an output coupled to the control node and having a first input coupled to the fine tuning analog signal input conductor; and forming a temperature compensation voltage generating circuit having an output coupled to a second input of the analog multiplexing circuit. The fine tuning analog signal input conductor, the first varactor, the second varactor, the analog multiplexing circuit and the temperature compensation voltage generating circuit are all parts of the integrated circuit and are all fabricated substantially simultaneously using an integrated circuit fabrication process.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, VCO 47 of FIG. 8 is controlled by software and/or firmware executing in digital baseband processor integrated circuit 4. The software and/or firmware may, for example, be the program 6 of processor-executable instructions that is stored in processor-readable medium 7. Processor 5 executes this program 6 of instructions and as a result controls VCO 47 in RF transceiver integrated circuit 3 by sending appropriate digital control information across serial bus 10. Sets of digital control values (S1[1-3], S1[1-3]B, S2[1-3], 52[1-3]B, S3[1-3], TC1[1-2], TC2[1-2] and TC3[1-2]) for controlling resonator 59 may be stored in memory 7 in digital baseband integrated circuit 4, where each set is stored in association with a corresponding VCO frequency operating range.

Although certain specific embodiments are described above for instructional purposes, the teachings of this patent document have general applicability and are not limited to the specific embodiments described above. The temperature compensated resonator need not be used in a VCO, but rather sees general applicability. Accordingly, various modifications, adaptations, and combinations of the various features of the described specific embodiments can be practiced without departing from the scope of the claims that are set forth below.

What is claimed is:

1. An apparatus comprising:
    a first node;
    a second node;
    a first signal input conductor;
    a second signal input conductor;
    a main varactor circuit comprising:
        a first main varactor circuit portion comprising:
            a first varactor having a first lead and a second lead, wherein the first lead of the first varactor is coupled to the first node;
            a second varactor having a first lead and a second lead, wherein the first lead of the second varactor is coupled to the second node, and wherein the second lead of the second varactor is coupled to the second lead of the first varactor at a first control node; and a first analog multiplexing circuit that couples a selected one of the first signal input conductor and the second signal input conductor to the first control node;
an auxiliary varactor circuit coupled between the first node and the second node;
a first temperature compensation voltage generating circuit having an output lead coupled to the second signal input conductor; and
a second temperature compensation voltage generating circuit having an output lead coupled to the auxiliary varactor circuit.

2. The apparatus of claim 1, wherein a first analog control signal is present on the first signal input conductor, and wherein a second analog control signal is present on the second signal input conductor.

3. The apparatus of claim 2, wherein the first analog control signal is a fine tuning control signal received from a loop filter, and wherein the second analog control signal is a signal that varies as a function of temperature.

4. The apparatus of claim 1, wherein the first temperature compensation voltage generating circuit supplies a first Temperature Compensation Analog Voltage Control Signal (TCAVCS) onto the second signal input conductor, wherein the first TCAVCS has a voltage that varies as a function of temperature.

5. The apparatus of claim 4, wherein the voltage of the first TCAVCS varies as a function of temperature in a first way if a digital control value received by the first temperature compensation voltage generating circuit has a first digital value, whereas the voltage of the first TCAVCS varies as a function of temperature in a second way if the digital control value received by the first temperature compensation voltage generating circuit has a second digital value.

6. The apparatus of claim 1, wherein the main varactor circuit further comprises:
a second main varactor circuit portion comprising:
a third varactor having a first lead and a second lead, wherein the first lead of the third varactor is coupled to the first node;
a fourth varactor having a first lead and a second lead, wherein the first lead of the fourth varactor is coupled to the second node, and wherein the second lead of the fourth varactor is coupled to the second lead of the third varactor at a second control node; and
a second analog multiplexing circuit that couples a selected one of the first signal input conductor and the second signal input conductor to the second control node.

7. The apparatus of claim 6, wherein the apparatus is a Voltage Controlled Oscillator (VCO) that receives a multi-bit digital tuning word, wherein a first digital bit of the multi-bit digital tuning word controls the first analog multiplexing circuit, and wherein a second digital bit of the multi-bit digital tuning word controls the second analog multiplexing circuit.

8. The apparatus of claim 1, wherein the apparatus is a Voltage Controlled Oscillator (VCO) that receives a Fine Tuning Analog Voltage Control Signal (FTAVCS) from a loop filter onto the first signal input conductor.

9. The apparatus of claim 1, wherein the first lead of the first varactor is coupled to the first node by a first capacitor, and wherein the first lead of the second varactor is coupled to the second node by a second capacitor.

10. The apparatus of claim 1, wherein the first lead of the first varactor is directly connected to the first node so that the first lead of the first varactor is a part of the first node, and wherein the first lead of the second varactor is directly connected to the second node so that the first lead of the second varactor is a part of the second node.

11. The apparatus of claim 1, wherein the first analog multiplexing circuit comprises:
a first transistor operative to be conductive so that it couples the first signal input conductor to the first control node when a digital control signal has a first digital value, and operative to be nonconductive when the digital control signal has a second digital value opposite the first digital value; and
a second transistor operative to be conductive so that it couples the second signal input conductor to the first control node when the digital control signal has the second digital value, and operative to be nonconductive when the digital control signal has a first digital value.

12. The apparatus of claim 1, wherein the auxiliary varactor circuit comprises:
a first auxiliary varactor circuit portion coupled to provide a first capacitance between the first node and the second node, wherein the first capacitance varies as a function of temperature.

13. The apparatus of claim 12, wherein the auxiliary varactor circuit further comprises:
a second auxiliary varactor circuit portion coupled to provide a second capacitance between the first node and the second node, wherein the second capacitance varies as a function of temperature.

14. The apparatus of claim 13, wherein the apparatus is a Voltage Controlled Oscillator (VCO) that receives a Fine Tuning Analog Voltage Control Signal (FTAVCS) from a loop filter onto the first signal input conductor, and wherein the FTAVCS is not supplied to the first auxiliary varactor circuit portion and is not supplied to the second auxiliary varactor circuit portion.

15. The apparatus of claim 14, wherein the first auxiliary varactor circuit portion receives a first digital control bit that at least in part determines a magnitude of the first capacitance, and wherein the second auxiliary varactor circuit portion receives a second digital control bit that at least in part determines a magnitude of the second capacitance.

16. The apparatus of claim 1, wherein the auxiliary varactor circuit is coupled to provide a digitally programmable temperature dependent capacitance between the first node and the second node, wherein the auxiliary varactor circuit receives a digital control value that at least in part determines a magnitude of the digitally programmable temperature dependent capacitance.

17. The apparatus of claim 16, wherein the apparatus is a Voltage Controlled Oscillator (VCO) that receives a Fine Tuning Analog Voltage Control Signal (FTAVCS) from a loop filter onto the first signal input conductor, and wherein the FTAVCS is not supplied to the auxiliary varactor circuit.

18. The apparatus of claim 1, further comprising:
a digitally programmable coarse tuning capacitor bank circuit coupled to provide a digitally programmable capacitance between the first node and the second node.

19. The apparatus of claim 1, further comprising:
a digitally programmable coarse tuning capacitor bank circuit coupled to provide a digitally programmable capacitance between the first node and the second node, wherein the digitally programmable coarse tuning capacitor bank circuit comprises:
a first capacitor bank circuit portion that is coupled to the first node and that is coupled to the second node and that receives a first digital control bit, wherein the first digital control bit at least in part determines a first capacitance provided by the first capacitor bank circuit portion between the first and second nodes; and a second capacitor bank circuit portion that is coupled to the first node and that is coupled to the second node and that receives a second digital control bit, wherein the second digital control bit at least in part determines a second capacitance provided by the second capacitor bank circuit portion between the first and second nodes.

20. The apparatus of claim 19, wherein the first capacitor bank circuit portion includes a first transistor that is on when the first digital control bit has a first digital value, wherein the first capacitance provided by the first capacitor bank circuit portion when the first digital control bit has the first digital value varies in a first way with temperature, wherein the first transistor is off when the first digital control bit has a second digital value opposite the first digital value, wherein the first capacitance provided by the first capacitor bank circuit portion when the first digital control bit has the second digital value varies in a second way with temperature.

21. The apparatus of claim 20, wherein the varying of the first capacitance in the second way is at least in part due to a reverse biased diode in the first capacitor bank circuit portion, wherein the first capacitor bank circuit portion receives an analog voltage control signal that at least in part determines a capacitance of the reverse biased diode.

22. The apparatus of claim 1,
wherein the first temperature compensation voltage generating circuit outputs a first Temperature Compensation Analog Voltage Control Signal (TCAVCS) to the main varactor circuit, wherein the first temperature compensation voltage generating circuit receives a first multi-bit digital value, and wherein the first multi-bit digital value determines a first programmable slope of how the first TCAVCS varies as a function of temperature, and
wherein the second temperature compensation voltage generating circuit outputs a second Temperature Compensation Analog Voltage Control Signal (TCAVCS) to the auxiliary varactor circuit, wherein the second temperature compensation voltage generating circuit receives a second multi-bit digital value, and wherein the second multi-bit digital value determines a second programmable slope of how the second TCAVCS varies as a function of temperature.

23. The apparatus of claim 22, wherein the main varactor is coupled to receive a Fine Tuning Analog Voltage Control Signal (FTAVCS) from a loop filter, and wherein the FTAVCS is not supplied to the auxiliary varactor circuit.

24. An apparatus that receives a Fine Tuning Analog Voltage Control Signal (FTAVCS) and a multi-bit digital control word, the apparatus comprising:
a main varactor circuit comprising a plurality of main varactor circuit portions that can be selectably enabled or disabled, wherein the main varactor circuit portions are coupled together in parallel between a first node and second node , wherein each of the plurality of main varactor circuit portions receives a first Temperature Compensation Analog Voltage Control Signal (TCAVCS), and wherein each of the plurality of main varactor circuit portions receives the FTAVCS;
an auxiliary varactor circuit comprising a plurality of auxiliary varactor circuit portions that can be selectably enabled or disabled, wherein the auxiliary varactor circuit portions are coupled together in parallel between the first and second nodes, wherein each of the plurality of auxiliary varactor circuit portions receives a second Temperature Compensation Analog Voltage Control Signal (TCAVCS), wherein none of the auxiliary varactor circuit portions receives the FTAVCS; and
a digitally programmable coarse tuning capacitor bank circuit comprising a plurality of capacitor bank circuit portions that can be selectably enabled or disabled, wherein the capacitor bank circuit portions are coupled together in parallel, wherein none of the plurality of capacitor bank circuit portions receives the FTAVCS, wherein the multi-bit digital control word determines how many and which of the main varactor circuit portions, the auxiliary varactor circuit portions, and the capacitor bank circuit portions are enabled.

25. The apparatus of claim 24, wherein a capacitance of any of the main varactor circuit portions that is not enabled is controlled as a function of temperature, wherein a capacitance of any of the auxiliary varactor circuit portions that is not enabled is controlled as a function of temperature, and wherein a capacitance of any of the capacitor bank circuit portions that is not enabled is controlled as a function of temperature.

26. The apparatus of claim 24, the apparatus further comprising:
a first temperature compensation voltage generating circuit that supplies the first TCAVCS to each of the main varactor circuit portions, wherein the multi-bit digital control word determines how the first TCAVCS varies with temperature;
a second temperature compensation voltage generating circuit that supplies the second TCAVCS to each of the auxiliary varactor circuit portions, wherein the multi-bit digital control word determines how the second TCAVCS supplied to the auxiliary varactor circuit portions varies with temperature; and
a third temperature compensation voltage generating circuit that supplies a third TCAVCS to each of the capacitor bank circuit portions, wherein the multi-bit digital control word determines how the third TCAVCS supplied to the capacitor bank circuit portions varies with temperature.

27. The apparatus of claim 24, wherein each of the main varactor circuit portions comprises a first varactor having a lead coupled to a control node, a second varactor having a lead coupled to the control node, and an analog multiplexing circuit coupled to supply a signal onto the control node.

28. The apparatus of claim 27, wherein the multi-bit digital control word controls the analog multiplexing circuits of the main varactor circuit portions.

29. A method comprising:
receiving a Fine Tuning Analog Voltage Control Signal (FTAVCS) onto an input conductor of a Voltage Controlled Oscillator (VCO);
generating a first Temperature Compensation Analog Voltage Control Signal (TCAVCS) having a voltage that changes as a function of temperature;
generating a second Temperature Compensation Analog Voltage Control Signal (TCAVCS) having a voltage that changes as a function of temperature;
supplying a selected one of the FTAVCS and the first TCAVCS onto a control node of a first main varactor circuit portion;
supplying a selected one of the FTAVCS and the first TCAVCS onto a control node of a second main varactor circuit portion, wherein the first and second main varactor circuit portions are coupled together in parallel between a first and second node and are parts of the VCO and supplying a selected one of the first and the second TCAVCS to an auxiliary varactor circuit, wherein the auxiliary varactor circuit is coupled in parallel with the main varactor circuit and is a part of the VCO, wherein the auxiliary varactor circuit does not receive the FTAVCS, wherein the auxiliary varactor circuit has a digitally programmable temperature dependent variable capacitance, and wherein a multi-bit digital control word at least in part determines a magnitude of the digitally programmable temperature dependent variable capacitance.

30. The method of claim 29, further comprising:
receiving the multi-bit digital control word onto the VCO, wherein the multi-bit digital control word determines which one of the FTAVCS and the first TCAVCS is supplied onto the control node of the first main varactor circuit portion, wherein the multi-bit digital control word determines which one of the FTAVCS and the first TCAVCS is supplied onto the control node of the second main varactor circuit portion; and wherein the multi-bit digital control word determines which one of the first and second TCAVCS is supplied onto the control node of the auxiliary varactor circuit.

31. The method of claim 30, wherein the first and second main varactor circuit portions are parts of a main varactor circuit.

32. The method of claim 30, wherein the first and second main varactor circuit portions are parts of a main varactor circuit, the method further comprising:
controlling a digitally programmable coarse tuning capacitor bank circuit coupled in parallel with the main varactor circuit, wherein the digitally programmable coarse tuning capacitor bank circuit is a part of the VCO, wherein the digitally programmable coarse tuning capacitor bank circuit has a digitally programmable capacitance, and wherein the multi-bit digital control word at least in part determines a magnitude of the digitally programmable capacitance.

33. The method of claim 29, further comprising:
receiving the multi-bit digital control word onto the VCO, wherein the multi-bit digital control word determines how the first and second TCAVCS changes as a function of temperature.

34. The method of claim 29, wherein the first main varactor circuit portion comprises:
a first varactor having a first lead and a second lead, wherein the first lead of the first varactor is coupled to a first node;
a second varactor having a first lead and a second lead, wherein the first lead of the second varactor is coupled to a second node, and wherein the second lead of the second varactor is coupled to the second lead of the first varactor at a first control node; and
a first analog multiplexing circuit that couples a selected one of the FTAVCS and the first TCAVCS onto the first control node, and
wherein the second main varactor circuit portion comprises:
a third varactor having a first lead and a second lead, wherein the first lead of the third varactor is coupled to the first node;
a fourth varactor having a first lead and a second lead, wherein the first lead of the fourth varactor is coupled to the second node, and wherein the second lead of the fourth varactor is coupled to the second lead of the third varactor at a second control node; and
a second analog multiplexing circuit that couples a selected one of the FTAVCS and the first TCAVCS onto the second control node.

35. An apparatus comprising:
a first signal input conductor for receiving a Fine Tuning Analog Voltage Control Signal (FTAVCS) from a loop filter;
a second signal input conductor for receiving a first Temperature Compensation Analog Voltage Control Signal (TCAVCS), wherein the first TCAVCS has a voltage that varies as a function of temperature;
a third signal input conductor for receiving a second Temperature Compensation Analog Voltage Control Signal (TCAVCS), wherein the second TCAVCS has a voltage that varies as a function of temperature;
means for providing a first variable capacitance between a first node and a second node such that if a first digital control bit has a first digital value then the FTAVCS on the first signal input conductor is used to control the first variable capacitance whereas if the first digital control bit has a second digital value opposite the first digital value then the first TCAVCS on the second signal input conductor is used to control the first variable capacitance; and
means for providing a second variable capacitance between the first node and the second node such that if a second digital control bit has a third digital value then the first TCAVCS on the second signal input conductor is used to control the second variable capacitance whereas if the second digital control bit has a fourth digital value opposite the third digital value then the second TCAVCS on the third signal input conductor is used to control the second variable capacitance.

36. The apparatus of claim 35, further comprising:
means for providing a third variable capacitance between the first node and the second node such that if a third digital control bit has a first digital value then the FTAVCS on the first signal input conductor is used to control the second variable capacitance whereas if the second digital control bit has a second digital value opposite the first digital value then the TCAVCS on the second signal input conductor is used to control the second variable capacitance.

37. The apparatus of claim 36, wherein the apparatus is a Voltage Controlled Oscillator (VCO), and wherein the means for providing the first variable capacitance, the means for providing the second variable capacitance, and the means for providing the third variable capacitance are parts of a main varactor circuit of the VCO.

38. The apparatus of claim 37, further comprising:
a temperature compensation voltage generating circuit that generates the first TCAVCS such that if a digital control value received by means for generating has a first digital value then the voltage of the first TCAVCS varies as a function of temperature in a first way, whereas if the digital control value received by the means for generating has a second digital value then the voltage of the first TCAVCS varies as a function of temperature in a second way.

39. A non-transitory processor-readable medium storing a set of processor-executable instructions, wherein execution of the set of processor-executable instructions by a processor is for:
causing the processor to generate first control information for controlling a first main varactor circuit such that a selected one of a Fine Tuning Analog Voltage Control Signal (FTAVCS) and a first Temperature Compensation Analog Voltage Control Signal (TCAVCS) is supplied onto a control node of the first main varactor circuit, wherein the FTAVCS is received from a loop filter of a VCO, wherein the first TCAVCS has a voltage that varies with temperature, and wherein the first main varactor circuit is a part of the VCO; and causing the processor to generate second control information for controlling a first auxiliary varactor circuit such that a selected one of the first TCAVCS and a second Temperature Compensation Analog Voltage Control Signal (TCAVCS) is supplied onto a control node of the first auxiliary varactor circuit, wherein the second TCAVCS has a voltage that varies with temperature, wherein the first main varactor circuit is coupled in parallel with the first auxiliary varactor circuit, and wherein the first auxiliary varactor circuit is a part of the VCO.

40. The processor-readable medium of claim 39, wherein execution of the set of processor-executable instructions is also for:

causing the processor to generate third control information for controlling a second main varactor circuit such that a selected one of the FTAVCS and the first TCAVCS is supplied onto a control node of the second main varactor circuit, and wherein the second main varactor circuit is a part of the VCO.

41. The processor-readable medium of claim 39, wherein execution of the set of processor-executable instructions is also for:

causing the processor to generate fourth control information for controlling a voltage generating circuit that generates the first TCAVCS such that the voltage of the first TCAVCS varies in a first way with temperature if the fourth control information has a first digital value whereas the voltage of the first TCAVCS varies in a second way with temperature if the fourth control information has a second digital value.

42. A method of manufacturing an integrated circuit comprising:

fabricating a fine tuning analog signal input conductor;

fabricating a first varactor and a second varactor such that a lead of the first varactor is coupled to a first control node and such that a lead of the second varactor is coupled to the first control node;

fabricating a third varactor and a fourth varactor such that a lead of the third varactor is coupled to a second control node and such that a lead of the fourth varactor is coupled to the second control node;

fabricating a first analog multiplexing circuit having an output coupled to the first control node, and having a first input coupled to the fine tuning analog signal input conductor;

fabricating a second analog multiplexing circuit having an output coupled to the second control node;

fabricating a first temperature compensation voltage generating circuit having an output coupled to a second input of the first and second analog multiplexing circuits;

fabricating a second temperature compensation voltage generating circuit having an output coupled to a first input of the second analog multiplexing circuit, wherein the fine tuning analog signal input conductor, the first varactor, the second varactor, the third varactor, the fourth varactor, the first and second analog multiplexing circuits and the first and second temperature compensation voltage generating circuits are all parts of the integrated circuit.

* * * * *